(12) United States Patent
Takahashi et al.

(10) Patent No.: US 12,347,364 B2
(45) Date of Patent: Jul. 1, 2025

(54) DISPLAY AND ELECTRONIC DEVICE INCLUDING THE DISPLAY

(71) Applicant: Semiconductor Energy Laboratory Co., Ltd., Atsugi (JP)

(72) Inventors: Kei Takahashi, Isehara (JP); Koji Kusunoki, Isehara (JP); Kazunori Watanabe, Machida (JP); Susumu Kawashima, Atsugi (JP); Kouhei Toyotaka, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/372,738

(22) Filed: Sep. 26, 2023

(65) Prior Publication Data

US 2024/0021150 A1    Jan. 18, 2024

Related U.S. Application Data

(63) Continuation of application No. 17/562,425, filed on Dec. 27, 2021, now Pat. No. 11,783,757, which is a
(Continued)

(30) Foreign Application Priority Data

Dec. 25, 2017   (JP) ................. 2017-247227
Feb. 22, 2018   (JP) ................. 2018-029746

(51) Int. Cl.
  *G09G 3/32*   (2016.01)
  *H10D 86/40*   (2025.01)
  (Continued)

(52) U.S. Cl.
  CPC ............. *G09G 3/32* (2013.01); *H10D 86/423* (2025.01); *H10D 86/60* (2025.01);
  (Continued)

(58) Field of Classification Search
  CPC .. G09G 3/32; G09G 3/3233; G09G 2310/066; G09G 2300/0809;
  (Continued)

(56) References Cited

U.S. PATENT DOCUMENTS 6,400,101 B1   6/2002   Biebl et al.
7,180,479 B2   2/2007   Kimura
(Continued)

FOREIGN PATENT DOCUMENTS

CN   001674062 A   9/2005
CN   001698084 A   11/2005
(Continued)

OTHER PUBLICATIONS

International Search Report (Application No. PCT/IB2018/059848) Dated Mar. 19, 2019.
(Continued)

*Primary Examiner* — Xuemei Zheng
(74) *Attorney, Agent, or Firm* — Eric J. Robinson; Robinson Intellectual Property Law Office, P.C.

(57) ABSTRACT

A novel display is provided. A display having a small change in chromaticity of a micro light-emitting diode in proportion to current density is provided. A display capable of reducing power consumption in the driver circuit when displaying a still image is provided. The display includes a plurality of pixels each including a display element and a microcontroller. The microcontroller includes a first transistor, a triangular wave generator circuit, a comparator, a switch, and a constant current circuit. The first transistor has a function of retaining a potential corresponding to data written to the pixel by being switched off. The triangular wave generator circuit has a function of generating a triangular wave signal. The comparator has a function of generating an output signal corresponding to the potential and the
(Continued)

triangular wave signal. The switch has a function of controlling whether or not to make a current flowing in the constant current circuit flow to the display element in accordance with the output signal.

15 Claims, 13 Drawing Sheets

Related U.S. Application Data continuation of application No. 16/768,720, filed as application No. PCT/IB2018/059848 on Dec. 11, 2018, now Pat. No. 11,222,583.

(51) Int. Cl.
| | |
|---|---|
| *H10D 86/60* | (2025.01) |
| *H01L 25/075* | (2006.01) |
| *H10D 30/67* | (2025.01) |
| *H10H 20/825* | (2025.01) |

(52) U.S. Cl.
CPC .......... *G09G 2300/0809* (2013.01); *G09G 2310/0243* (2013.01); *G09G 2310/06* (2013.01); *H01L 25/0753* (2013.01); *H10D 30/6755* (2025.01); *H10H 20/825* (2025.01)

(58) Field of Classification Search
CPC .......... G09G 2310/0243; H01L 27/124; H01L 27/1255; H01L 27/1225; H10D 86/60; H10D 86/423; H10D 86/40; H10D 86/441; H10D 86/481
See application file for complete search history.

(56) References Cited

U.S. PATENT DOCUMENTS

| | | | |
|---|---|---|---|
| 7,358,935 | B2 | 4/2008 | Yamashita et al. |
| 7,580,016 | B2 | 8/2009 | Kim et al. |
| 7,633,496 | B2 | 12/2009 | Kasai et al. |
| 8,164,548 | B2 | 4/2012 | Kimura |
| 8,624,802 | B2 | 1/2014 | Kimura |
| 9,105,813 | B1 | 8/2015 | Chang |
| 9,153,171 | B2 | 10/2015 | Sakariya et al. |
| 9,219,197 | B1 | 12/2015 | Chen et al. |
| 9,231,153 | B2 | 1/2016 | Chen et al. |
| 9,590,137 | B2 | 3/2017 | Chen et al. |
| 9,608,614 | B2 | 3/2017 | Sugiyama et al. |
| 9,818,344 | B2 | 11/2017 | Lin et al. |
| 9,906,212 | B2 | 2/2018 | Sugiyama et al. |
| 10,152,936 | B2 | 12/2018 | Nakagawa et al. |
| 10,158,043 | B2 | 12/2018 | Chen et al. |
| 10,187,048 | B2 | 1/2019 | Sugiyama et al. |
| 10,354,585 | B2 | 7/2019 | Lin et al. |
| 10,395,589 | B1 | 8/2019 | Vahid Far et al. |
| 10,395,590 | B1* | 8/2019 | Lin ................. G09G 3/3275 |
| 10,504,432 | B2 | 12/2019 | Lin et al. |
| 10,559,249 | B2 | 2/2020 | Yoneda |
| 10,615,786 | B2 | 4/2020 | Sugiyama et al. |
| 10,714,009 | B2 | 7/2020 | Lin et al. |
| 10,847,077 | B2 | 11/2020 | Sakariya et al. |
| 10,997,917 | B2 | 5/2021 | Lin et al. |
| 11,138,918 | B2 | 10/2021 | Sakariya et al. |
| 11,232,748 | B2 | 1/2022 | Lin et al. |
| 2002/0047642 | A1 | 4/2002 | Miyagawa |
| 2003/0214522 | A1 | 11/2003 | Kageyama et al. |
| 2005/0156828 | A1 | 7/2005 | Yamashita et al. |
| 2006/0214876 | A1 | 9/2006 | Jendbro et al. |
| 2010/0102752 | A1 | 4/2010 | Chen et al. |
| 2010/0289832 | A1 | 11/2010 | Yamamoto et al. |
| 2013/0187150 | A1* | 7/2013 | Yamazaki ......... H01L 29/78696 257/43 |
| 2013/0288426 | A1* | 10/2013 | Akimoto ........... H01L 29/66765 438/104 |
| 2014/0292745 | A1 | 10/2014 | Kikuchi et al. |
| 2014/0367705 | A1 | 12/2014 | Bibl et al. |
| 2015/0339979 | A1 | 11/2015 | Kikuchi et al. |
| 2015/0349200 | A1* | 12/2015 | Chen ...................... H01L 33/38 257/98 |
| 2016/0056179 | A1* | 2/2016 | Toriumi ................ H01L 27/088 257/43 |
| 2017/0039935 | A1* | 2/2017 | Yang .................... G09G 3/3258 |
| 2017/0140724 | A1* | 5/2017 | Lin ....................... G09G 3/3233 |
| 2017/0162113 | A1 | 6/2017 | Lin et al. |
| 2017/0162115 | A1* | 6/2017 | Chen ................... H10K 59/1213 |
| 2017/0186365 | A1 | 6/2017 | Yoneda |
| 2017/0186782 | A1* | 6/2017 | Lee ..................... G09G 3/3233 |
| 2017/0187360 | A1 | 6/2017 | Uesugi et al. |
| 2017/0316750 | A1 | 11/2017 | Yamazaki et al. |
| 2018/0005570 | A1* | 1/2018 | Wang .................. G09G 3/3233 |
| 2018/0182279 | A1 | 6/2018 | Sakariya et al. |
| 2019/0191504 | A1* | 6/2019 | Mao ..................... H10K 59/86 |
| 2020/0027388 | A1 | 1/2020 | Iwaki et al. |
| 2022/0059010 | A1 | 2/2022 | Sakariya et al. |
| 2022/0114962 | A1 | 4/2022 | Lin et al. |

FOREIGN PATENT DOCUMENTS

| | | |
|---|---|---|
| CN | 101276528 A | 10/2008 |
| CN | 101887684 A | 11/2010 |
| CN | 104103233 A | 10/2014 |
| CN | 105552190 A | 5/2016 |
| CN | 206210357 U | 5/2017 |
| CN | 107038994 A | 8/2017 |
| EP | 1447787 A | 8/2004 |
| EP | 1455335 A | 9/2004 |
| EP | 1879170 A | 1/2008 |
| EP | 3089225 A | 11/2016 |
| EP | 3096363 A | 11/2016 |
| EP | 3168884 A | 5/2017 |
| EP | 3706108 A | 9/2020 |
| JP | 2002-111786 A | 4/2002 |
| JP | 2003-504797 | 2/2003 |
| JP | 2006-351503 A | 12/2006 |
| JP | 2008-535208 | 8/2008 |
| JP | 2014-202778 A | 10/2014 |
| JP | 2015-126454 A | 7/2015 |
| JP | 2015-225104 A | 12/2015 |
| JP | 2016-508231 | 3/2016 |
| JP | 2016-213441 A | 12/2016 |
| JP | 2017-120412 A | 7/2017 |
| JP | 2017-211644 A | 11/2017 |
| KR | 2006-0003492 A | 1/2006 |
| KR | 2018-0098336 A | 9/2018 |
| TW | 201447860 | 12/2014 |
| WO | WO-2003/038795 | 5/2003 |
| WO | WO-2003/052728 | 6/2003 |
| WO | WO-2006/099997 | 9/2006 |
| WO | WO-2008/006756 | 1/2008 |
| WO | WO-2014/099499 | 6/2014 |
| WO | WO-2015/180651 | 12/2015 |
| WO | WO-2016/196390 | 12/2016 |
| WO | WO-2017/095537 | 6/2017 |

OTHER PUBLICATIONS

Written Opinion (Application No. PCT/IB2018/059848) Dated Mar. 19, 2019.
Chinese Office Action (Application No. 201880077499.2) Dated Aug. 31, 2022.
Taiwanese Office Action (Application No. 107144258) Dated Sep. 2, 2022.

* cited by examiner

DISPLAY AND ELECTRONIC DEVICE INCLUDING THE DISPLAY

TECHNICAL FIELD

One embodiment of the present invention relates to a display and an electronic device including the display.

BACKGROUND ART

In recent years, a display and a lighting device including a micro light-emitting diode (hereinafter, referred to as a micro LED (LED: Light Emitting Diode)) are being proposed (e.g., Patent Document 1). A display including a micro LED is capable of high luminance, and therefore has the advantage that an image projected on a wall or a desk can be seen, visibility outdoors is improved, and the like and is being actively researched and developed as a next-generation display.

The luminance of a micro LED changes in proportion to the current density. The chromaticity of a micro LED changes slightly in response to the current density. Patent Document 2 discloses a structure in which pulse width modulation (PWM) control is performed on a micro LED.

Favorable chromaticity and a desired luminance can be achieved by driving a micro LED through performing PWM control.

REFERENCE

Patent Document

[Patent Document 1] Specification of United States Patent Application Publication No. 2014/0367705
[Patent Document 2] Specification of United States Patent Application Publication No. 2010/0102752

SUMMARY OF THE INVENTION

Problems to be Solved by the Invention

A structure in which the luminance of a micro LED is controlled by PWM control is effective when performing display with favorable chromaticity. However, a driver circuit needs to continuously operate even when a still image is displayed.

An object of one embodiment of the present invention is to provide a novel display and an electronic device including the display. Alternatively, another object of one embodiment of the present invention is to provide a display having a small change in chromaticity of a micro light-emitting diode with respect to the current density even when the operation of the driver circuit is stopped for reduction in power consumption in displaying a still image.

One embodiment of the present invention does not necessarily achieve all the above objects and only needs to achieve at least one of the objects. The descriptions of the above objects do not preclude the existence of other objects. Objects other than these will be apparent from and can be derived from the descriptions of the specification, the claims, the drawings, and the like.

Means for Solving the Problems

One embodiment of the present invention is a display including a plurality of pixels. The pixels include a display element and a microcontroller. The display element includes a micro light-emitting diode. The microcontroller includes a first transistor, a triangular wave generator circuit, a comparator, a switch, and a constant current circuit. The first transistor has a function of retaining a potential corresponding to data written to the pixels by being turned off. The triangular wave generator circuit has a function of generating a triangular wave signal. The comparator has a function of generating an output signal corresponding to the potential and the triangular wave signal. The switch has a function of controlling whether or not to make a current flowing in the constant current circuit flow to the display element in accordance with the output signal.

One embodiment of the present invention is a display including a plurality of pixels and a triangular wave generator circuit. The pixels include a display element and a microcontroller. The triangular wave generator circuit has a function of generating a triangular wave signal and a function of outputting the triangular wave signal to the pixels. The display element includes a micro light-emitting diode. The microcontroller includes a first transistor, a comparator, a switch, and a constant current circuit. The first transistor has a function of retaining a potential corresponding to data written to the pixels by being turned off. The comparator has a function of generating an output signal corresponding to the potential and the triangular wave signal. The switch has a function of controlling whether or not to make a current flowing in the constant current circuit flow to the display element in accordance with the output signal.

One embodiment of the present invention is preferably the display in which the first transistor includes a first semiconductor layer including a channel formation region, and the first semiconductor layer includes an oxide semiconductor.

One embodiment of the present invention is preferably the display in which the comparator and the switch include a second transistor, the second transistor includes a second semiconductor layer including a channel formation region, and the second semiconductor layer includes silicon.

One embodiment of the present invention is preferably the display in which the constant current circuit includes a third transistor and a fourth transistor, the third transistor includes a third semiconductor layer including a channel formation region, the third semiconductor layer includes an oxide semiconductor, the fourth transistor includes a fourth semiconductor layer including a channel formation region, and the fourth semiconductor layer includes silicon.

One embodiment of the present invention is preferably the display in which the micro light-emitting diode is an element including an active layer and a clad layer including gallium nitride and a compound of indium and gallium nitride.

One embodiment of the present invention is an electronic device including the above display.

Note that other embodiments of the present invention will be shown in the embodiments described below and the drawings.

Effect of the Invention

With one embodiment of the present invention, a novel display and an electronic device including the display can be provided. Alternatively, with one embodiment of the present invention, a display having a small change in chromaticity of a micro light-emitting diode with respect to the current density even when the operation of the driver circuit is stopped for reduction in power consumption in displaying a still image can provided.

The descriptions of the above effects do not preclude the existence of other effects. One embodiment of the present invention does not have to have all of these effects. Effects other than these will be apparent from and can be derived from the descriptions of the specification, the claims, the drawings, and the like.

MODE FOR CARRYING OUT THE INVENTION

Figure 1A:
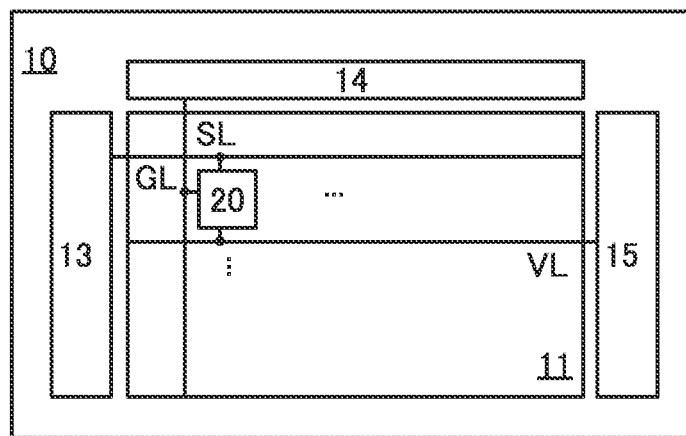
FIGS. 1A-1C A block diagram and circuit diagrams illustrating a configuration example of a display.

Hereinafter, embodiments are described with reference to drawings. Note that the embodiments can be implemented with many different modes, and it is readily appreciated by those skilled in the art that modes and details can be changed in various ways without departing from the spirit and scope of the present invention. Thus, the present invention should not be interpreted as being limited to the following description of the embodiments.

Note that ordinal numbers such as "first," "second," and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

Embodiment 1

In this embodiment, configuration examples of a display of one embodiment of the present invention will be described.

FIG. 1(A) is a block diagram of a display of one embodiment of the present invention. A display 10 shown in FIG. 1(A) includes a gate driver 13, a source driver 14, a power supply circuit 15, and a display portion 11. The display portion 11 includes a plurality of pixels 20.

The gate driver 13 has a function of outputting a signal for driving the pixels 20, for example, a scan signal, to a wiring GL. The source driver 14 has a function of outputting a signal for driving the pixels 20, for example, pixel data (also referred to as image data or video data), to a wiring SL. The power supply circuit 15 has a function of outputting a power supply voltage for driving the pixels 20, for example, a voltage VDD, to a wiring VL.

Figure 1B:
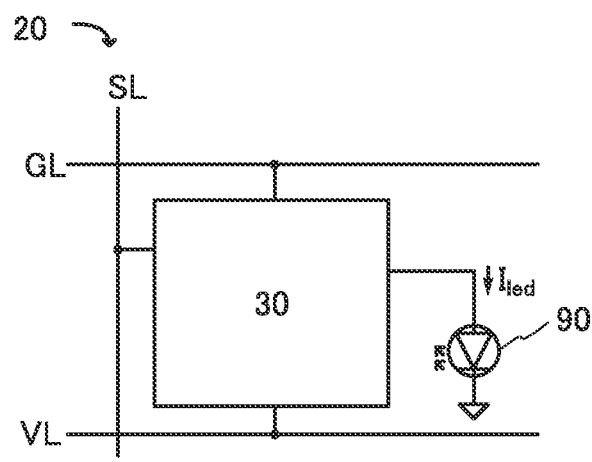

FIG. 1(B) is a diagram for explaining the configuration of the pixel 20 shown in FIG. 1(A). The pixel 20 includes a microcontroller 30 and a display element 90.

The microcontroller 30 is connected to the wiring SL, the wiring GL, and the wiring VL. The wiring SL is a wiring having a function of transmitting image data to the pixel 20. The wiring GL is a wiring having a function of transmitting a scan signal for writing or retaining image data to/in the pixel. The wiring VL is a wiring having a function of transmitting the power supply voltage VDD to the pixel 20.

The display element 90 is a micro LED. A micro LED is, for example, a light-emitting diode whose one side is about 10 μm to 100 μm. For the light-emitting diode included in the display element 90, an inorganic material, for example, gallium nitride and a compound of indium and gallium nitride can be used. With such a configuration, the lifetime of the display element 90 can be longer than that of a display element using an organic material. Since the light-emitting diode included in the display element 90 is a self-emitting element and can achieve excellent black display, a display with favorable contrast ratio can be achieved. Furthermore, since the display element 90 can emit light with different wave lengths such as red, green, and blue, color display that does not require a color filter or a polarizing plate can be achieved with low power consumption.

Moreover, since the display element 90 is capable of high-speed response to an output current, a time grayscale method in which a constant current circuit is provided in a pixel and duty driving is performed can be employed. Therefore, the display element 90 can be driven by pulse width modulation control; thus, favorable chromaticity and desired luminance can be obtained.

Furthermore, since the display element 90 has a high emission efficiency compared to a display element using an organic material, a display with favorable visibility outdoors can be achieved. Furthermore, the display element 90 can be used as lighting because of its extremely high luminance.

The microcontroller 30 has a function of performing grayscale display on the display element 90 by PWM control in accordance with the pixel data input to the microcontroller 30. The microcontroller 30 has a function of retaining pixel data. By the microcontroller 30 having a function of retaining pixel data, the function of a circuit with a function to output pixel data, for example the source driver 14, can be intermittently stopped during the period when the pixel data is retained in the microcontroller 30.

The microcontroller 30 includes a circuit for generating signals with different dusty ratio in accordance with the pixel data. The microcontroller 30 includes a switch and a constant current circuit. The microcontroller 30 has a function of controlling the on/off of the switch in accordance with a signal generated inside the microcontroller 30. The microcontroller 30 has a function of making the current generated in the constant current circuit ($I_{led}$) flow to the display element 90 by turning on the switch intermittently. With such a configuration, different PWM control can be performed on each light-emitting element LED; thus, favorable chromaticity and desired luminance can be obtained.

With the configuration of one embodiment of the present invention, power consumption can be reduced by stopping the operation of the source driver 14 during the period when continuous writing of pixel data is unnecessary, such as when displaying a still image, and PWM control can be performed on the display element 90 which is a light-emitting diode; hence, a display having a small change in chromaticity can be achieved.

Figure 1C:
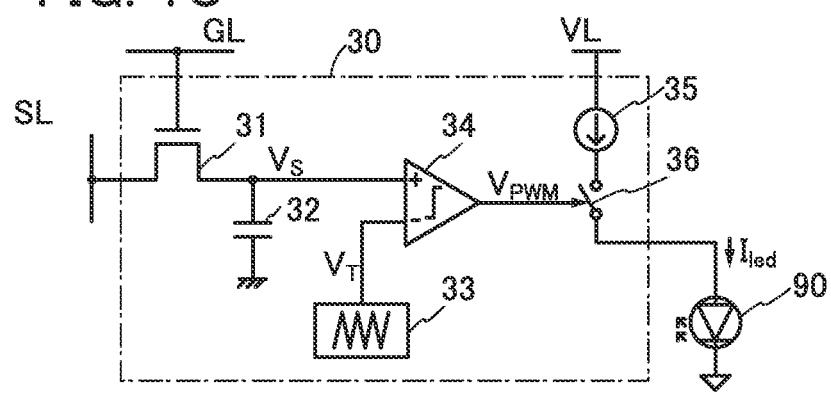

FIG. 1(C) is a diagram illustrating a configuration example of the microcontroller 30 illustrated in FIG. 1(B). The microcontroller 30 includes a transistor 31, a capacitor 32, a triangular wave generator circuit 33, a comparator 34, a constant current circuit 35, and a switch 36.

One of a source and a drain of the transistor 31 is connected to the wiring SL. A gate of the transistor 31 is connected to the wiring GL. The other of the source and the drain of the transistor 31 is connected to a non-inversion input terminal of the comparator 34. As illustrated in FIG. 1(C), a node where the other of the source and the drain of the transistor 31 and the non-inversion input terminal of the comparator 34 are connected is referred to as a node $V_S$. The capacitor 32 is connected to the node $V_S$. The capacitor 32 is used to increase charge retention characteristics in the node $V_S$, and can be omitted.

In the transistor 31, a current that flows between the source and the drain during an off state (off-state current) is preferably low. The use of a transistor with extremely low off-state current enables a potential of the node $V_S$, i.e., a potential corresponding to the pixel data written to the pixel 20 to be retained for a long time. Thus, the transistor 31 can function as a sample-and-hold circuit. For the transistor 31, a transistor using a metal oxide in a channel formation region (hereinafter referred to as an OS transistor) can be used, for example. The metal oxide includes In, Zn, and M (M is Al, Ti, Ga, Sn, Y, Zr, La, Ce, Nd, or Hf). The OS transistor will be described in detail in an embodiment below.

The triangular wave generator circuit 33 has a function of outputting a triangular wave for performing PWM control. The triangular wave generator circuit 33 is connected to an inversion input terminal of the comparator 34. As illustrated in FIG. 1(C), a node where the triangular wave generator circuit 33 and the inversion input terminal of the comparator 34 are connected is referred to as a node $V_T$.

The comparator 34 functions as a comparison circuit. The non-inversion input terminal is connected to one of the source and the drain of the transistor 31, i.e., the node $V_S$, to be supplied with the potential of the node $V_S$. The inversion input terminal is connected to a wiring which supplies a triangular wave of the triangular wave generator circuit 33, i.e., the node $V_T$, to be supplied with a potential of the node $V_T$. A potential $V_{PWM}$ which changes the magnitude relationship between the potential of the node $V_S$ and the potential of the node $V_T$ is output from an output terminal. That is, the comparator 34 generates an output signal corresponding to a triangular wave signal and a potential that corresponds to the pixel data retained in the microcontroller 30.

The constant current circuit 35 is a circuit that functions as a constant current source. The constant current circuit 35 is connected to the wiring VL. The constant current circuit 35 is connected in series to the switch 36. The constant current circuit 35 may have a configuration where data for supplying a constant current is written from the outside and retained and a constant current is supplied, or a configuration where a potential is generated inside and a constant current corresponding to the potential is supplied.

The switch 36 functions as a switch that is turned on or off to control whether the current supplied by the constant current circuit 35 flows as the current $I_{led}$ that is supplied to the display element 90. The on/off of the switch 36 is controlled by a signal of the output terminal of the comparator 34.

For transistors included in the triangular wave generator circuit 33, the comparator 34, the switch 36, and the constant current circuit 35, transistors including silicon in a channel formation region (Si transistors) are preferably used. As a Si transistor, a transistor including single crystal silicon in a semiconductor layer can be given. A Si transistor has a high current which flows between the source and the drain in an on state (on-state current) compared to an OS transistor. A Si transistor is preferably applied to a circuit such as the switch 36 that requires high-speed switching of an operation such as PWM control. However, one embodiment of the present invention is not limited thereto. For example, the transistors included in the triangular wave generator circuit 33, the comparator 34, the switch 36, and the constant current circuit 35 may be OS transistors.

When Si transistors are used as the transistors included in the triangular wave generator circuit 33, the comparator 34, the switch 36, and the constant current circuit 35, a configuration where an OS transistor used as the transistor 31 is stacked thereover can be employed. With such a configuration, the circuit area included in the microcontroller 30 can be reduced.

Note that the constant current circuit 35 described above preferably has a configuration where an OS transistor with low off-state current is used so that data for supplying a constant current is written from the outside and retained. This configuration is preferable because the circuit area can be reduced by stacking a Si transistor and an OS transistor and the number of transistors can be reduced.

Figure 2:
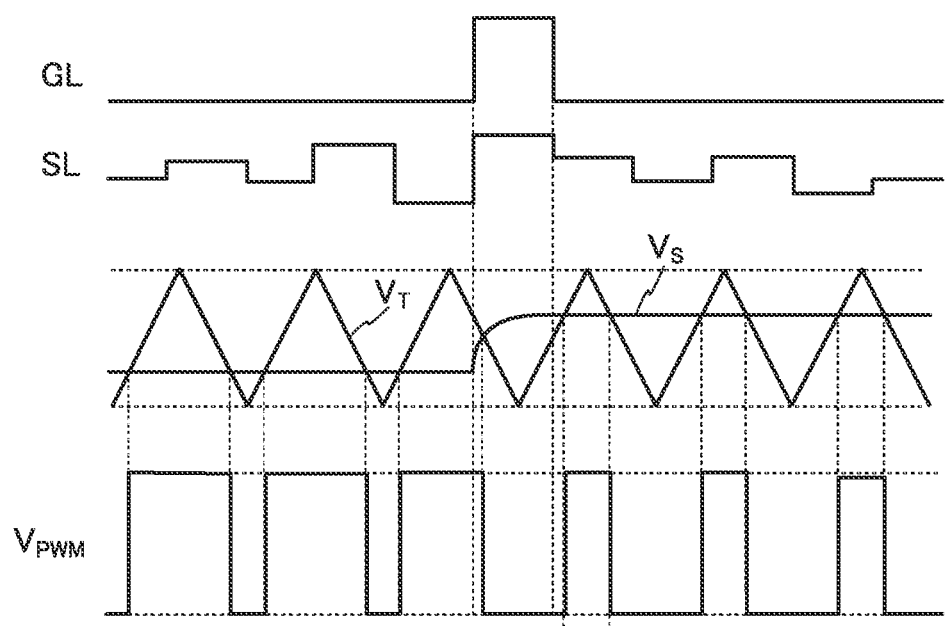
FIG. 2 A waveform diagram illustrating a configuration example of a display.

FIG. 2 is a waveform chart for explaining the operation of the display of one embodiment of the present invention described in FIGS. 1(A) to 1(C). FIG. 2 illustrates waveforms of the wiring SL, the wiring GL, the node $V_S$, the node $V_T$, and the potential $V_{PWM}$ of the output terminal of the comparator 34, which are shown in FIG. 1(C).

As illustrated in FIG. 2, a potential corresponding to the pixel data supplied to the pixel in each row is supplied to the wiring SL. The potential corresponding to the pixel data is retained in the node $V_S$. The potential retained in the node $V_S$ is continuously retained by the wiring GL being set to an L level. The node $V_T$ is supplied with a potential by a triangular wave of a constant amplitude voltage and a frequency. The pulse width (duty) with the change in the potential $V_{PWM}$ is determined by the magnitude relationship in potential between the node $V_S$ and the node $V_T$. The potential retained in the node $V_S$ is updated by setting the wiring GL to an H level. The potential $V_{PWM}$ changes by the potential retained in the node $V_S$ being updated. The grayscale can be switched to a desired level by the potential $V_{PWM}$ changing and the current $I_{led}$ flowing periodically with a set interval.

With the configuration of one embodiment of the present invention, grayscale display based on PWM control can be performed in the pixels 20 even when the operation of the source driver 14 is stopped in a period during which repeated writing of pixel data is not required, such as a period during which a still image is displayed. Thus, power consumption can be reduced and a display having a small change in chromaticity can be achieved.

Note that one embodiment of the present invention is not limited to the configuration described in FIGS. 1(A) to 1(C). The configuration in FIGS. 3(A) to 3(C) can be adopted as another configuration.

Figure 3A:
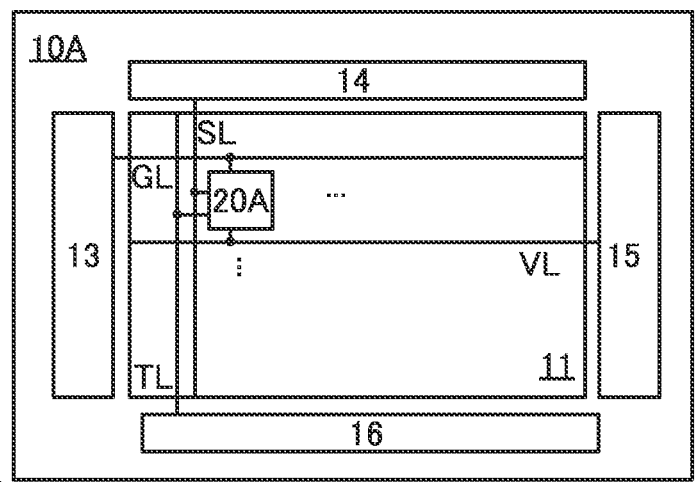
FIGS. 3A-3C A block diagram and circuit diagrams illustrating a configuration example of a display.

A display 10A illustrated in FIG. 3(A) includes the gate driver 13, the source driver 14, the power supply circuit 15, the display portion 11, and a triangular wave generator circuit 16. In other words, FIG. 3(A) corresponds to a configuration in which the triangular wave generator circuit 33 described in FIGS. 1(A) to 1(C) is placed outside of the display portion 11 to be the triangular wave generator circuit 16. The display portion 11 includes a plurality of pixels 20A.

Figure 3B:
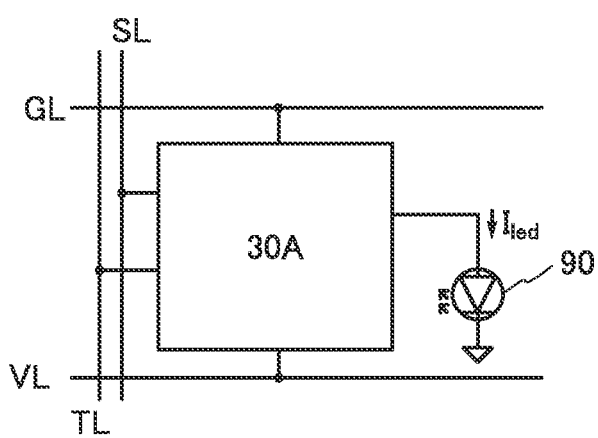

FIG. 3(B) is a diagram for explaining the configuration of the pixels 20A illustrated in FIG. 3(A). The pixel 20A includes a microcontroller 30A and the display element 90. The microcontroller 30A is connected to the wiring SL, the wiring GL, the wiring VL, and a wiring TL. The wiring TL has a function of transmitting a triangular wave generated by a triangular wave generator circuit 33D.

Figure 3C:
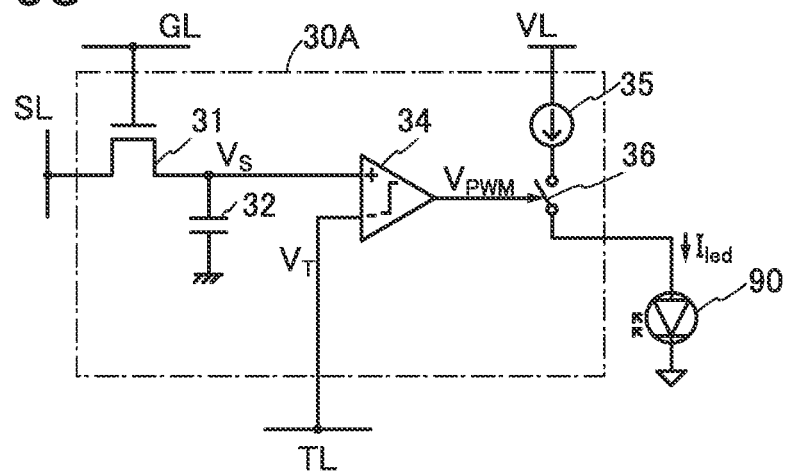

FIG. 3(C) is a diagram for explaining a configuration example of the microcontroller 30A illustrated in FIG. 3(B). The microcontroller 30A includes the transistor 31, the capacitor 32, the comparator 34, the constant current circuit 35, and the switch 36. That is, FIG. 3(C) corresponds to a configuration in which the triangular wave generator circuit 33 illustrated in FIG. 1(C) is eliminated. In the microcontroller 30A, a triangular wave is supplied via the wiring TL.

Note that one embodiment of the present invention is not limited to the configuration described in FIG. 3(A) to FIG. 3(C). The configuration in FIGS. 4(A) and 4(B) can be adopted as another configuration.

Figure 4A:
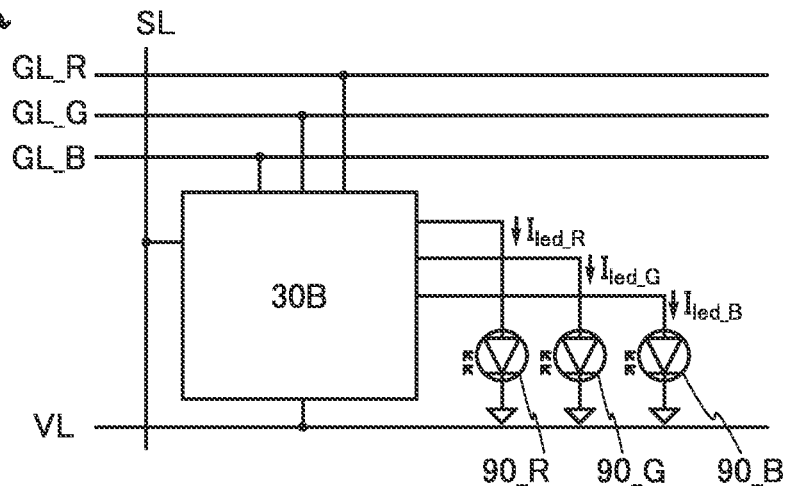
FIGS. 4A-4B Circuit diagrams illustrating a configuration example of a display.

A diagram for explaining a configuration of a pixel 20B of a display shown in FIG. 4(A) illustrates a configuration where one microcontroller 30B controls currents $I_{led\_R}$, $I_{led\_G}$, and $I_{led\_B}$, which are supplied to three display elements 90_R, 90_G, and 90_B, respectively. The microcontroller 30B is connected to the wiring SL, a wiring GL_R, a wiring GL_G, a wiring GL_B, and the wiring VL. The wiring GL_R, the wiring GL_G, and the wiring GL_B are wirings that are supplied with signals to write pixel data supplied to the wiring SL to the microcontroller 30B at different timings.

Figure 4B:
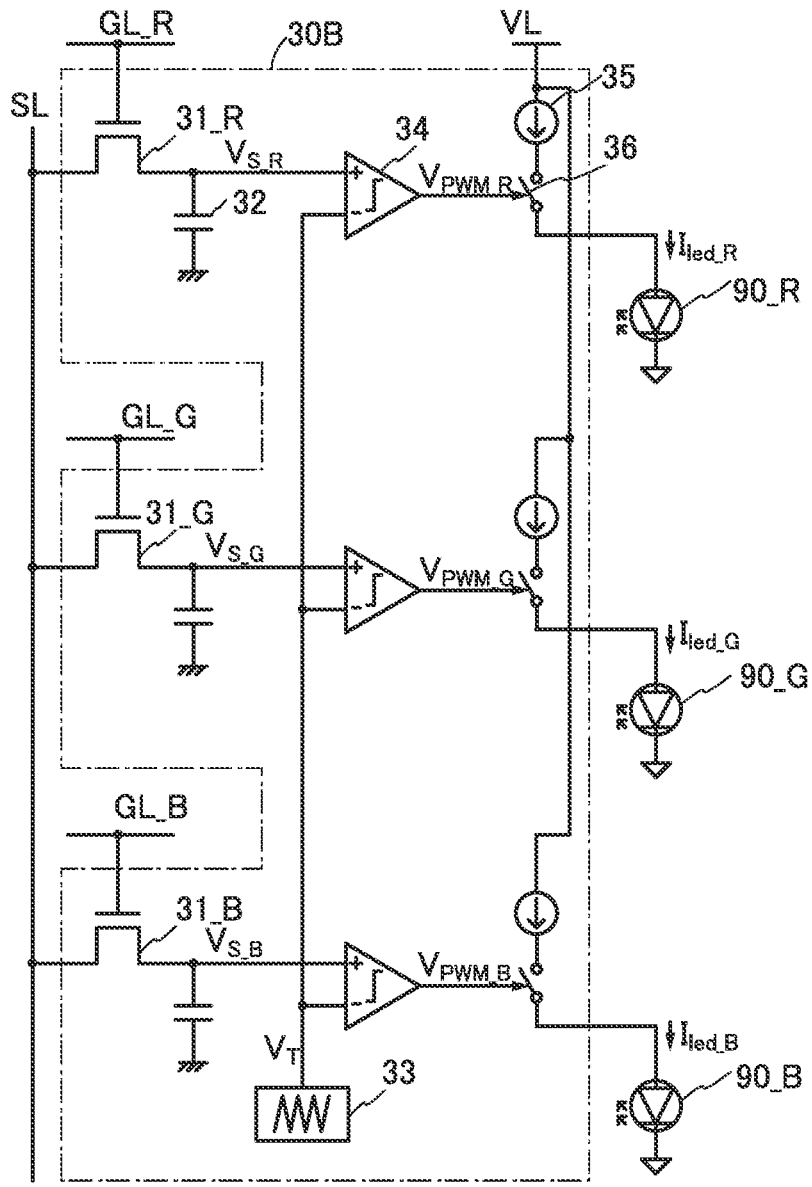

FIG. 4(B) is a diagram for explaining a configuration example of the microcontroller 30B illustrated in FIG. 4(A). The microcontroller 30B includes transistors 31_R, 31_G, and 31_B, the capacitor 32, the comparator 34, the constant current circuit 35, and the switch 36, in addition to the components and the triangular wave generator circuit 33 illustrated in FIG. 1(C). The transistors 31_R, 31_G, and 31_B are supplied with signals to write pixel data at different timings by the wiring GL_R, the wiring GL_G, and the wiring GL_B. Then, pixel data is retained in separate nodes $V_{S\_R}$, $V_{S\_G}$, and $V_{S\_B}$ in the microcontroller 30B, whereby separate PWM control ($V_{PWM\_R}$, $V_{PWM\_G}$, and $V_{PWM\_B}$) can be performed on the display element 90 corresponding to each color.

Note that one embodiment of the present invention is not limited to the configuration described in FIGS. 4(A) and 4(B). A configuration in FIGS. 5(A) and 5(B) can be adopted as another configuration.

Figure 5A:
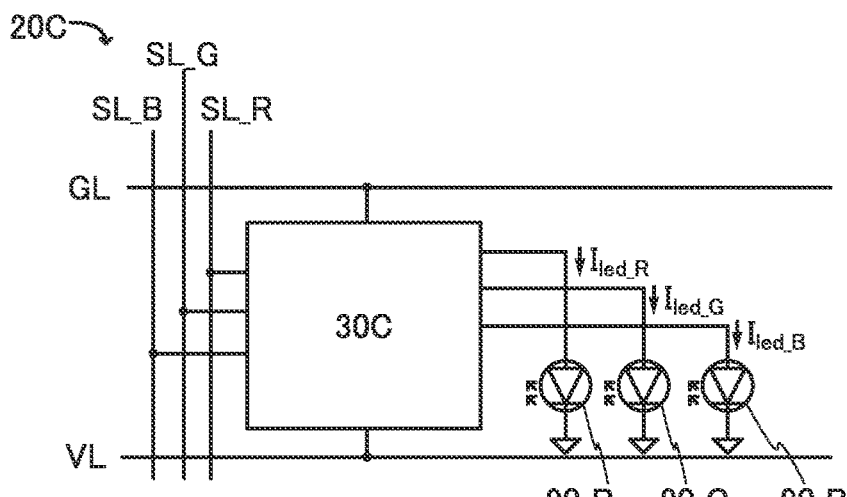
FIGS. 5A-5B Circuit diagrams illustrating a configuration example of a display.

A diagram for explaining a configuration of a pixel 20C shown in FIG. 5(A) illustrates a configuration where one microcontroller 30C controls currents $I_{led\_R}$, $I_{led\_G}$, and $I_{led\_B}$, which are supplied to the three display elements 90_R, 90_G, and 90_B, respectively. The microcontroller 30C is connected to the wiring GL, a wiring SL_R, a wiring SL_G, a wiring SL_B, and the wiring VL. The wiring SL_R, the wiring SL_G, and the wiring SL_B are wirings for writing separate pixel data to the microcontroller 30C at a timing when the wiring GL is at an H level.

Figure 5B:
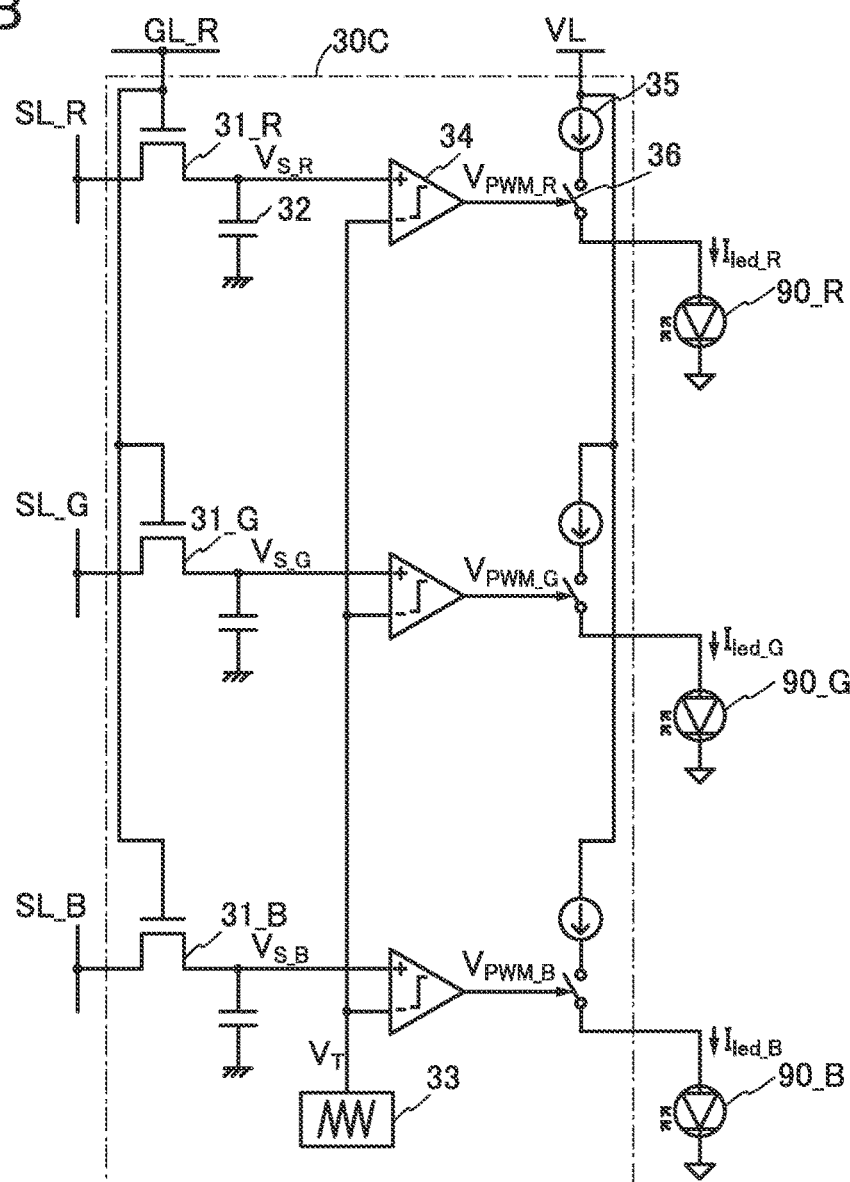

FIG. 5(B) is a diagram for explaining a configuration example of the microcontroller 30C illustrated in FIG. 5(A). The microcontroller 30C includes the plurality of transistors 31_R, 31_G, and 31_B, the capacitor 32, the comparator 34, the constant current circuit 35, and the switch 36, in addition to the components and the triangular wave generator circuit 33 illustrated in FIG. 1(C). The transistors 31_R, 31_G, and 31_B are supplied with signals to write pixel data from the wiring SL_R, the wiring SL_G, and the wiring SL_B at the same timing by the wiring GL. Then, pixel data is retained in the separate nodes $V_{S\_R}$, $V_{S\_G}$, and $V_{S\_B}$ in the microcontroller 30C, whereby separate PWM control ($V_{PWM\_R}$, $V_{PWM\_G}$, and $V_{PWM\_B}$) can be performed on the display element 90 corresponding to each color.

Next, configuration examples of the constant current circuit 35 explained in FIG. 1(C) and the like are described with reference to FIGS. 6(A) and 6(B) and FIGS. 7(A) and 7(B).

Figure 6A:
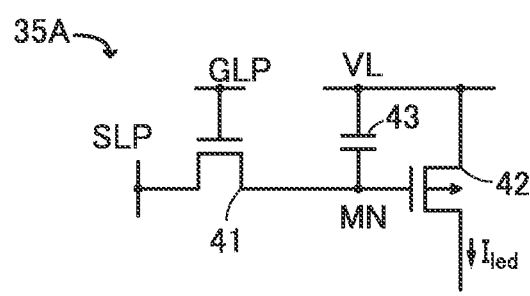
FIGS. 6A-6B Circuit diagrams illustrating configuration examples of a display.

FIG. 6(A) illustrates a configuration example of a constant current circuit 35A using an OS transistor. FIG. 6(A) illustrates a transistor 41 formed with an OS transistor, a p-channel transistor 42 formed with a Si transistor, and a capacitor 43. A wiring GLP is supplied with a signal that controls the on/off of the transistor 41. A wiring SLP is supplied with a signal to be retained in a node MN. The node MN generates $I_{led}$ which flows through the transistor 42 in accordance with the potential of a signal held in the node MN. The capacitor 43 retains a charge which is supplied to the node MN. With the transistor 41 being an OS transistor with low off-state current, change in potential due to leak current in the node MN can be suppressed.

Figure 6B:
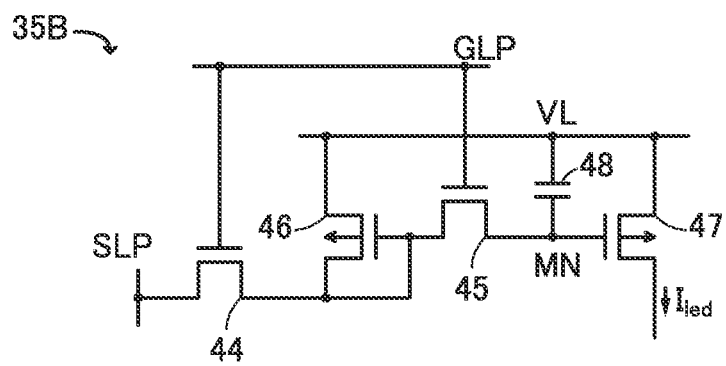

FIG. 6(B) illustrates a configuration example of a constant current circuit 35B using an OS transistor. FIG. 6(B) illustrates a transistor 44 and a transistor 45 formed with OS transistors, p-channel transistor 46 and transistor 47 formed with Si transistors, and a capacitor 48. The wiring GLP is supplied with a signal for controlling the on/off of the transistor 44 and the transistor 45. The wiring SLP is supplied with a signal to be held in the node MN. The node MN generates $I_{led}$ which flows through the transistor 46 in accordance with the potential of a signal held in the node MN. The capacitor 48 retains a charge which is supplied to the node MN. With the transistor 44 and the transistor 45 being OS transistors with low off-state current, change in potential due to leak current in the node MN can be suppressed. Note that in the configuration in FIG. 6(B), the transistor 46 and the transistor 47 constitute a current mirror. Thus, data can be written by a current programing method, and the display is less likely to be affected by variation in transistor characteristics among pixels.

Figure 7A:
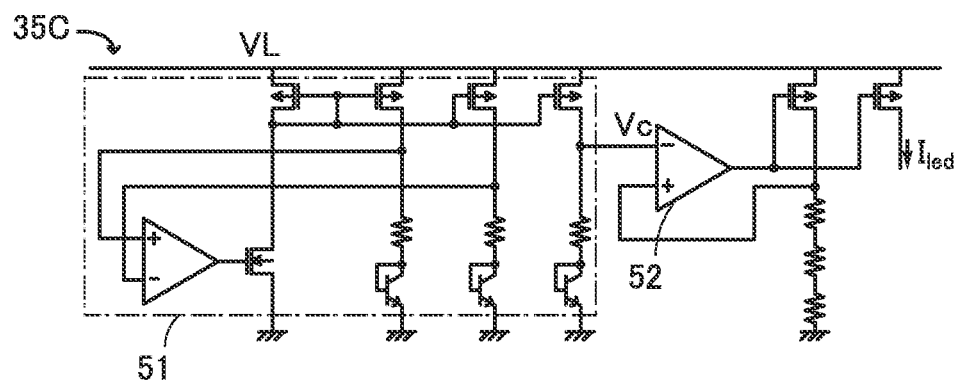
FIGS. 7A-7B Circuit diagrams illustrating configuration examples of a display.
Figure 7B:
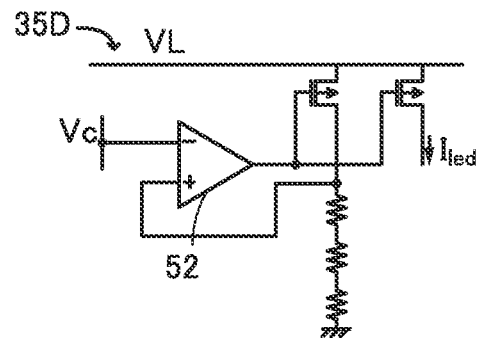

FIGS. 7(A) and 7(B) illustrate a configuration example of a constant current circuit using a Si transistor. In a constant current circuit 35C illustrated in FIG. 7(A), a plurality of transistors formed with Si transistors are included in a band gap reference circuit 51, an operational amplifier 52 and the like. The current $I_{led}$ is generated by a potential Vc being generated inside the band gap reference circuit 51. In the configuration of FIG. 7(A), the band gap reference circuit 51 can be omitted as shown in a constant current circuit 35D illustrated in FIG. 7(B) with a configuration in which the potential Vc is supplied from the outside.

Next, another configuration example of the transistor 31 illustrated in FIG. 1(C) and the like is described with reference to FIGS. 8(A) and 8(B).

Figure 8A:
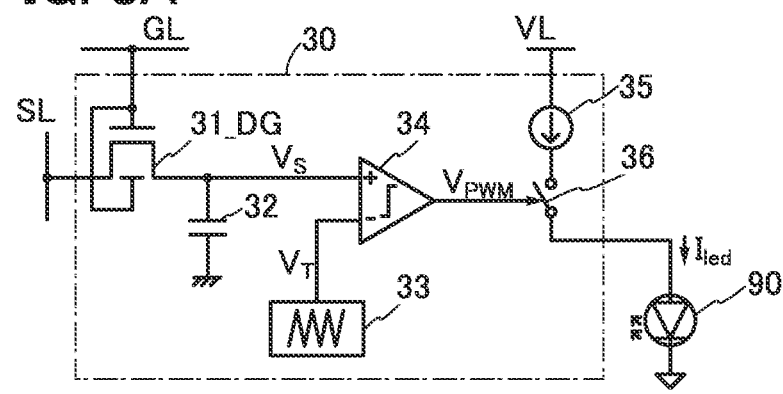
FIGS. 8A-8B Circuit diagrams illustrating configuration examples of a display.
Figure 8B:
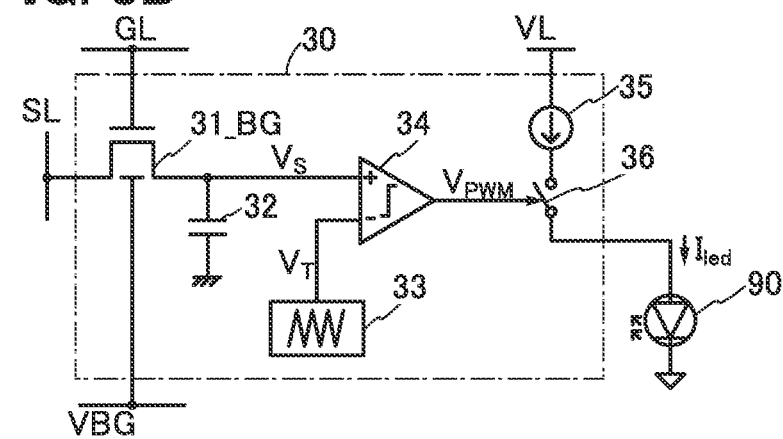

A transistor 31_DG included in the microcontroller 30 illustrated in FIG. 8(A) has a configuration in which a back gate is provided. The back gate is electrically connected to a front gate and has the effect of increasing on-state current. Note that a configuration in which a back gate can be supplied with a constant potential (VBG) different from that of a front gate may be employed as in a transistor 31_BG included in the microcontroller 30 illustrated in FIG. 8(B). With such a configuration, the threshold voltage of the transistor can be controlled. Furthermore, a configuration in which a transistor includes a back gate can also be used effectively in other circuits in this embodiment such as a constant current circuit.

This embodiment can be implemented in combination with any of the configurations described in the other embodiments and the like as appropriate.

Embodiment 2

In this embodiment, details of the OS transistor illustrated in Embodiment 1 will be described.

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that highly requires reliability, and the like. A CAC-OS has high mobility and is suitable for a transistor that operates at high speed, and the like.

An OS transistor has a large energy gap and thus has an extremely low off-state current. An OS transistor has features such that impact ionization, an avalanche breakdown, a short-channel effect, or the like does not occur, which are different from those of a Si transistor. Thus, the use of an OS transistor enables formation of a highly reliable circuit.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used to form a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%.

An oxide semiconductor with low carrier density is used for the semiconductor layer. For example, the semiconductor layer may use an oxide semiconductor whose carrier density is lower than or equal to $1 \times 10^{17}/cm^3$, preferably lower than or equal to $1 \times 10^{15}/cm^3$, more preferably lower than or equal to $1 \times 10^{13}/cm^3$, still more preferably lower than or equal to $1 \times 10^{11}/cm^3$, even more preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. The oxide semiconductor has a low density of defect states and can be referred to as an oxide semiconductor with stable characteristics.

Note that, without limitation to those described above, a material with an appropriate composition may be used in accordance with required semiconductor characteristics and electrical characteristics (e.g., field-effect mobility and threshold voltage) of a transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is an element belonging to Group 14, is contained in the oxide semiconductor contained in the semiconductor layer, the amount of oxygen vacancies is increased in the semiconductor layer, and the semiconductor layer becomes n-type. Thus, the concentration of silicon or carbon (measured by secondary ion mass spectrometry) in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to lower than or equal to $1 \times 10^{18}$ atoms/cm$^3$, preferably lower than or equal to $2 \times 10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (measured by secondary ion mass spectrometry) is preferably set to lower than or equal to $5 \times 10^{18}$ atoms/cm$^3$.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structure, an amorphous structure has the highest density of defect states, whereas CAAC-OS has the lowest density of defect states.

An oxide semiconductor film having an amorphous structure has disordered atomic arrangement and no crystalline component, for example. In another example, an oxide film having an amorphous structure has an absolutely amorphous structure and no crystal part.

Note that the semiconductor layer may be a mixed film including two or more of a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

Described below is the composition of a CAC (Cloud-Aligned Composite)-OS, which is one embodiment of a non-single-crystal semiconductor layer.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)) to form a mosaic pattern, and $InO_{X1}$ or $In_{X2}Zn_{Y2}O_{Z2}$ forming the mosaic pattern is evenly distributed in the film.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found by the X-ray diffraction measurement that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has a region with high luminance in a ring pattern and a plurality of bright spots appear in the ring pattern. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions containing $GaO_{X3}$ as a main component and the regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is generated. Accordingly, when regions containing $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region containing $GaO_{X3}$ or the like as a main component is more excellent than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element using a CAC-OS has high reliability. Thus, the CAC-OS is suitably used as a material in a variety of semiconductor devices.

This embodiment can be implemented in appropriate combination with any of the configurations described in the other embodiments and the like.

Embodiment 3

In this embodiment, a cross-sectional structure example of a semiconductor device 900 having a stacked-layer structure of Si transistors and OS transistors that can be used for the microcontroller 30 is described with reference to drawings. Note that the cross-sectional structure example described in this embodiment can be applied to the constant current circuit described in the above embodiment.

<Cross-Sectional Structure Example of Semiconductor Device 900>

Figure 9:
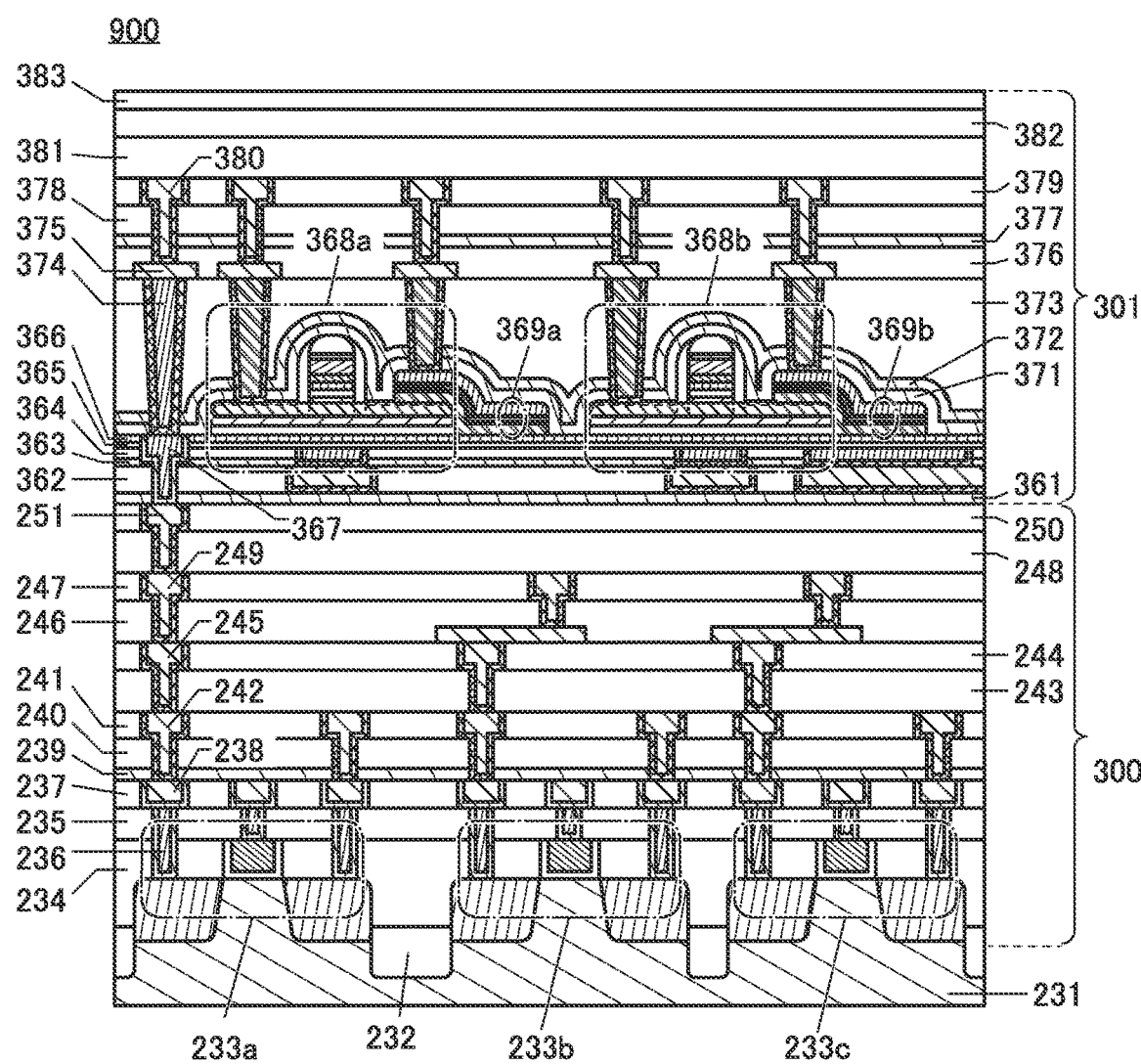
FIG. 9 A diagram showing a cross-sectional configuration of a semiconductor device.

FIG. 9 illustrates a cross section of part of the semiconductor device 900. In the semiconductor device 900 illustrated in FIG. 9, a layer 300 and a layer 301 are stacked over a substrate 231. FIG. 9 illustrates the case where a single crystal semiconductor substrate (for example, a single crystal silicon substrate) is used as the substrate 231. A source, a drain, and a channel of each transistor included in the layer 300 are formed in part of the substrate 231. In addition, the layer 301 includes thin film transistors (for example, OS transistors).

[Layer 300]

In FIG. 9, the layer 300 includes a transistor 233a, a transistor 233b, and a transistor 233c over the substrate 231. FIG. 9 illustrates cross sections of the transistor 233a, the transistor 233b, and the transistor 233c in the channel length direction.

As described above, the channels of the transistor 233a, the transistor 233b, and the transistor 233c are formed in part of the substrate 231. In the case where high-speed operation of an integrated circuit is required, a single crystal semiconductor substrate is preferably used as the substrate 231.

The transistor 233a, the transistor 233b, and the transistor 233c are electrically isolated from each other by an element isolation layer 232. For the formation of the element isolation layer, a LOCOS (Local Oxidation of Silicon) method, an STI (Shallow Trench Isolation) method, and the like can be used.

Furthermore, an insulating layer 234, an insulating layer 235, and an insulating layer 237 are provided over the transistor 233a, the transistor 233b, and the transistor 233c, and an electrode 238 is embedded in the insulating layer 237. The electrode 238 is electrically connected to one of a source and a drain of the transistor 233a through a contact plug 236.

Furthermore, an insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

Furthermore, an insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

Furthermore, an insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

Furthermore, an insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

[Layer 301]

The layer 301 is provided over the layer 300. In FIG. 9, the layer 301 includes a transistor 368a, a transistor 368b, a capacitor 369a, and a capacitor 369b. FIG. 9 illustrates cross sections of the transistor 368a and the transistor 368b in the channel length direction. Note that the transistor 368a and the transistor 368b are transistors each including a back gate.

In semiconductor layers of the transistor 368a and the transistor 368b, an oxide semiconductor which is a type of metal oxide is used. That is, OS transistors are used as the transistor 368a and the transistor 368b.

The transistor 368a and the transistor 368b are provided over an insulating layer 361 and an insulating layer 362. Furthermore, an insulating layer 363 and an insulating layer 364 are provided over the insulating layer 362. The back gates of the transistor 368a and the transistor 368b are embedded in the insulating layer 363 and the insulating layer 364. An insulating layer 365 and an insulating layer 366 are provided over the insulating layer 364. In addition, an electrode 367 is embedded in the insulating layer 361 to the insulating layer 366. The electrode 367 is electrically connected to the electrode 251.

Furthermore, an insulating layer 371, an insulating layer 372, and an insulating layer 373 are formed over the transistor 368a, the transistor 368b, the capacitor 369a, and the capacitor 369b, and an electrode 375 is formed over the insulating layer 373. The electrode 375 is electrically connected to the electrode 367 through a contact plug 374.

Furthermore, an insulating layer 376, an insulating layer 377, an insulating layer 378, and an insulating layer 379 are provided over the electrode 375. In addition, an electrode 380 is embedded in the insulating layer 376 to the insulating layer 379. The electrode 380 is electrically connected to the electrode 375.

Furthermore, an insulating layer 381 and an insulating layer 382 are provided over the electrode 380 and the insulating layer 379. An insulating layer 383 is provided over the insulating layer 382.

<Materials>

[Substrate]

Although there is no large limitation on a material used for a substrate, it is necessary that the substrate have heat resistance high enough to withstand at least heat treatment performed later. For example, a single crystal semiconductor substrate or a polycrystalline semiconductor substrate including silicon, silicon carbide, or the like as a material or a compound semiconductor substrate including silicon germanium or the like as a material can be used as the substrate. Furthermore, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high electron mobility transistor (HEMT) may be used. That is, the substrate is not limited to a simple supporting substrate, and may be a substrate where a device such as another transistor is formed.

Furthermore, a glass substrate of barium borosilicate glass, aluminoborosilicate glass, or the like, a ceramic substrate, a quartz substrate, a sapphire substrate, or the like can be used as the substrate. Note that a flexible substrate may be used as the substrate. In the case where a flexible substrate is used, a transistor, a capacitor, or the like may be directly fabricated over the flexible substrate, or the transistor, the capacitor, or the like may be fabricated over another fabrication substrate and then separated therefrom and transferred to the flexible substrate. Note that to perform separation from the fabrication substrate and transfer to the flexible substrate, a separation layer is preferably provided between the fabrication substrate and the transistor, the capacitor, or the like.

For the flexible substrate, for example, a metal, an alloy, a resin, glass, or fiber thereof can be used. The flexible substrate used as the substrate preferably has a lower coefficient of linear expansion because deformation due to an environment is inhibited. For the flexible substrate used as the substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (nylon, aramid, and the like), polyimide, polycarbonate, and acrylic. In particular, aramid is suitable for the flexible substrate because of its low coefficient of linear expansion.

[Insulating Layer]

For each of the insulating layers, a single layer or a stacked layer of materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. A material in which a plurality of materials selected from an oxide material, a nitride material, an oxynitride material, and a nitride oxide material are mixed may be used.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

Furthermore, in the case where an oxide semiconductor, which is a type of metal oxide, is used for the semiconductor layer, it is preferable to lower the hydrogen concentration in the insulating layer in order to prevent an increase in the hydrogen concentration in the semiconductor layer. Specifically, the hydrogen concentration in the insulating layer is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS). It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer is set to lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

It is preferable that at least a region of the insulating layer in contact with the semiconductor layer have few defects and typically have as few signals observed by electron spin resonance (ESR) spectroscopy as possible. Examples of the signals include an E' center observed at a g-factor of 2.001. Note that the E' center is due to the dangling bond of silicon. In the case where a silicon oxide layer or a silicon oxynitride layer is used as the insulating layer, for example, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ is used.

Furthermore, in addition to the above-described signal, a signal due to nitrogen dioxide (NO$_2$) might be observed. The signal is divided into the following three signals according to the N nuclear spin: a signal observed at a g-factor of greater than or equal to 2.037 and less than or equal to 2.039 (first signal), a signal observed at a g-factor of greater than or equal to 2.001 and less than or equal to 2.003 (second signal), and a signal observed at a g-factor of greater than or equal to 1.964 and less than or equal to 1.966 (third signal).

As the insulating layer, it is suitable to use an insulating layer whose spin density of the signal due to nitrogen dioxide (NO$_2$) is higher than or equal to $1\times10^{17}$ spins/cm$^3$ and lower than $1\times10^{18}$ spins/cm$^3$, for example.

Note that nitrogen oxide (NO$_x$) including nitrogen dioxide (NO$_2$) forms a state in the insulating layer. The state is positioned in the energy gap of the oxide semiconductor layer. Thus, when nitrogen oxide (NO$_x$) diffuses to the interface between the insulating layer and the oxide semiconductor layer, an electron is trapped by the state on the insulating layer side in some cases. As a result, the trapped electron remains in the vicinity of the interface between the insulating layer and the oxide semiconductor layer; thus, the threshold voltage of the transistor is shifted in the positive direction. Accordingly, the use of a film with a low nitrogen oxide content as the insulating layer can reduce a shift in the threshold voltage of the transistor.

As an insulating layer that releases a small amount of nitrogen oxide (NO$_x$), for example, a silicon oxynitride layer can be used. The silicon oxynitride layer is a film that releases more ammonia than nitrogen oxide (NO$_x$) in thermal desorption spectroscopy (TDS), and the typical released amount of ammonia is greater than or equal to $1\times10^{18}$/cm$^3$ and less than or equal to $5\times10^{19}$/cm$^3$. Note that the released amount of ammonia is the total amount in the range of the heat treatment temperature in TDS from 50° C. to 650° C. or from 50° C. to 550° C.

Since nitrogen oxide (NO$_x$) reacts with ammonia and oxygen in heat treatment, the use of an insulating layer that releases a large amount of ammonia reduces nitrogen oxide (NO$_x$).

Furthermore, it is preferable that at least one of the insulating layers in contact with the oxide semiconductor layer be formed using an insulating layer from which oxygen is released by heating. Specifically, it is preferable to use an insulating layer in which the amount of released oxygen converted into oxygen atoms is higher than or equal to $1.0\times10^{18}$ atoms/cm$^3$, higher than or equal to $1.0\times10^{19}$ atoms/cm$^3$, or higher than or equal to $1.0\times10^{20}$ atoms/cm$^3$ in TDS performed with heat treatment where the surface temperature of the insulating layer is higher than or equal to 100° C. and lower than or equal to 700° C., preferably higher than or equal to 100° C. and lower than or equal to 500° C.

Note that oxygen released by heating is also referred to as "excess oxygen" in this specification and the like.

Furthermore, an insulating layer containing excess oxygen can also be formed by performing treatment for adding oxygen to an insulating layer. The treatment for adding oxygen can be performed by heat treatment, plasma treatment, or the like in an oxidation atmosphere. Alternatively, oxygen may be added by an ion implantation method, an ion doping method, a plasma immersion ion implantation method, or the like. As a gas used for the treatment for adding oxygen, a gas including oxygen, e.g., an oxygen gas such as $^{16}O_2$ or $^{18}O_2$, a nitrous oxide gas, or an ozone gas, can be given. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (for example, an alkyl group or an aryl group) or a fluoro group as a substituent. In addition, the organic group may include a fluoro group.

There are no particular limitations on a method for forming the insulating layer. Note that a baking process is necessary in some cases depending on a material used for the insulating layer. In this case, the transistor can be fabricated efficiently when the baking process of the insulating layer also serves as another heat treatment process.

[Electrode]

As a conductive material for forming the electrodes, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. A semiconductor having high electric conductivity, typified by polycrystalline silicon including an impurity element such as phosphorus, or silicide such as nickel silicide may be used.

Moreover, a conductive material containing the above metal element and oxygen may be used. Furthermore, a conductive material containing the above metal element and nitrogen may be used. For example, a conductive material containing nitrogen, such as titanium nitride or tantalum nitride, may be used. In addition, indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Furthermore, indium gallium zinc oxide containing nitrogen may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed. Furthermore, a stacked-layer structure combining a conductive material containing nitrogen and a conductive material containing oxygen may be employed.

Note that in the case where an oxide semiconductor is used for the semiconductor layer and the gate electrode has a stacked-layer structure combining a material containing the above metal element and a conductive material containing oxygen, it is preferable to provide the conductive material containing oxygen on the semiconductor layer side. By providing the conductive material containing oxygen on the semiconductor layer side, oxygen released from the conductive material is easily supplied to the semiconductor layer.

For example, a conductive material with high embeddability, such as tungsten or polysilicon, is used for the electrode. Furthermore, a conductive material with high embeddability and a barrier layer (a diffusion prevention layer) such as a titanium layer, a titanium nitride layer, or a tantalum nitride layer may be used in combination. Note that an electrode may be referred to as a "contact plug".

It is particularly preferable to use a conductive material that is less likely to transmit impurities for the electrode in contact with a gate insulating layer. As an example of the conductive material that is less likely to transmit impurities, tantalum nitride can be given.

When an insulating material that is less likely to transmit impurities is used for the insulating layer, and a conductive material that is less likely to transmit impurities is used for the electrode in contact with a gate insulating layer, diffusion of impurities into the transistor can be further inhibited. Thus, the reliability of the transistor can be further increased. That is, the reliability of the semiconductor device can be further increased.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used. Furthermore, a compound semiconductor such as silicon germanium, silicon carbide, gallium arsenide, an oxide semiconductor, or a nitride semiconductor, an organic semiconductor, or the like can be used.

Furthermore, in the case of using an organic semiconductor for the semiconductor layer, a low molecular organic material having an aromatic ring, a π-electron conjugated conductive high molecule, or the like can be used. For example, rubrene, tetracene, pentacene, perylenediimide, tetracyanoquinodimethane, polythiophene, polyacetylene, or polyparaphenylene vinylene can be used.

Note that the semiconductor layers may be stacked. In the case of stacking the semiconductor layers, semiconductors having different crystal states may be used. Alternatively, different semiconductor materials may be used.

Furthermore, the band gap of an oxide semiconductor is greater than or equal to 2 eV; thus, when an oxide semiconductor is used for the semiconductor layer, a transistor with an extremely low off-state current can be achieved. Specifically, the off-state current per micrometer of channel width at room temperature (typically, 25° C.) and at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. Furthermore, a transistor using an oxide semiconductor for a semiconductor layer has high withstand voltage between a source and a drain. Thus, a transistor with high reliability can be provided. Furthermore, a transistor with high output voltage and high withstand voltage can be provided. Moreover, a semiconductor device or the like with high reliability can be provided. Furthermore, a semiconductor device or the like with high output voltage and high withstand voltage can be provided.

Furthermore, in this specification and the like, a transistor in which silicon having crystallinity is used for a semiconductor layer where a channel is formed is also referred to as a "crystalline Si transistor".

The crystalline Si transistor tends to have relatively high mobility compared with the OS transistor. On the other hand, the crystalline Si transistor has difficulty in achieving an extremely low off-state current unlike the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. In the case where the oxide semiconductor layer is formed by a sputtering method, as a sputtering gas, a rare gas (typically argon), oxygen, or a mixed gas of a rare gas and oxygen is used. In addition, increasing the purity of the sputtering gas is necessary. For example, as an oxygen gas or a rare gas used as the sputtering gas, a gas that is highly purified to have a dew point of −60° C. or lower, preferably −100° C. or lower is used. When the highly purified sputtering gas is used for deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of about $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably set lower than or equal to $1\times10^{-4}$ Pa, further preferably lower than or equal to $5\times10^{-5}$ Pa.

[Metal Oxide]

An oxide semiconductor preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of the above-described elements may be used in combination as the element M.

Note that in this specification and the like, a metal oxide containing nitrogen is also referred to as a metal oxide in some cases. Furthermore, a metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-singlecrystal oxide semiconductor. Examples of the non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structure which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor will be described.

Note that when the above metal oxide is used in a channel formation region of a transistor, a transistor having high field-effect mobility can be achieved. In addition, a transistor having high reliability can be achieved.

Furthermore, a metal oxide with a low carrier density is preferably used for a transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, the carrier density of a metal oxide is lower than $8\times10^{11}/cm^3$, preferably lower than $1\times10^{11}/cm^3$, further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of a transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon, which is a Group 14 element, is contained in a metal oxide, defect states are formed in the metal oxide. Thus, the concentration of silicon or carbon in the metal oxide and the concentration of silicon or carbon in the vicinity of an interface with the metal oxide (the concentration obtained by secondary ion mass spectrometry (SIMS)) are set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide which is obtained by SIMS is set lower than or equal to $1\times10^{18}$ atoms/cm$^3$, preferably lower than or equal to $2\times10^{16}$ atoms/cm$^3$.

When containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the channel formation region in the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide that contains hydrogen for its channel formation region is likely to have normally-on characteristics. Accordingly, hydrogen in the metal oxide is preferably reduced as much as possible. Specifically, the hydrogen concentration in the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which the impurity concentration is sufficiently reduced is used in a channel formation region of a transistor, stable electrical characteristics can be given.

<Deposition Method>

An insulating material for forming the insulating layers, a conductive material for forming the electrodes, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, an MBE (Molecular Beam Epitaxy) method, a PLD (Pulsed Laser Deposition) method, a dipping method, a spray coating method, a droplet discharging method (an ink-jet method or the like), or a printing method (screen printing, offset printing, or the like).

By a plasma CVD method, a high-quality film can be obtained at a relatively low temperature. With the use of a deposition method that does not use plasma at the time of deposition, such as an MOCVD method, an ALD method, or a thermal CVD method, damage is not easily caused on a formation surface. For example, a wiring, an electrode, an element (e.g., a transistor or a capacitor), or the like included in a semiconductor device might be charged up by receiving charges from plasma. In that case, accumulated charges might break the wiring, the electrode, the element, or the like included in the semiconductor device. By contrast, in the case of a deposition method not using plasma, such plasma damage is not caused; thus, the yield of semiconductor devices can be increased. Since plasma damage during deposition is not caused, a film with few defects can be obtained.

Unlike in a deposition method in which particles ejected from a target or the like are deposited, in a CVD method and an ALD method, a film is formed by reaction at a surface of an object. Thus, the CVD method and the ALD method are deposition methods that are less likely to be influenced by the shape of an object and thus have favorable step coverage. In particular, the ALD method enables excellent step coverage and excellent thickness uniformity and can be favorably used to cover a surface of an opening with a high aspect ratio, for example. On the other hand, the ALD method has a relatively low deposition rate; hence, it is sometimes preferable to combine the ALD method with another deposition method with a high deposition rate, such as the CVD method.

The CVD method and the ALD method enable control of the composition of a film to be obtained with a flow rate ratio of source gases. For example, by the CVD method or the ALD method, a film with a given composition can be deposited depending on the flow rate ratio of the source gases. Moreover, by the CVD method or the ALD method, a film whose composition is continuously changed can be deposited by changing the flow rate ratio of the source gases during the deposition. In the case of depositing a film while changing the flow rate ratio of the source gases, as compared with the case of depositing a film with the use of a plurality of deposition chambers, the time taken for the deposition can be shortened because the time taken for transfer and pressure adjustment is omitted. Thus, the productivity of a semiconductor device can be improved in some cases.

Note that in the case of deposition by the ALD method, a gas that does not contain chlorine is preferably used as a material gas.

This embodiment can be implemented in combination with any of the structures described in the other embodiments and the like as appropriate.

Embodiment 4

In this embodiment, examples of a mounting method of a microcontroller and a display element of one embodiment of the present invention will be described with reference to drawings.

A display of this embodiment uses a micro LED as a display element. Note that in this embodiment, a micro LED having a double heterojunction is described. Note that one embodiment of the present invention is not limited thereto, and a micro LED having a quantum well junction may be used.

When a micro LED is used as a display element of a display, luminance can be increased compared with a display using a liquid crystal element or an organic electroluminescence element. The use of a micro LED as a display element of a display eliminates the need for a structure in which a backlight is always on as in a liquid crystal display device; therefore, power consumption can be reduced. Moreover, a display using a micro LED as a display element has high contrast and a wide viewing angle; thus, the display quality can be improved.

The area of a light-emitting region of a micro LED is preferably less than or equal to 1 mm$^2$, further preferably less than or equal to 10000 µm$^2$, still further preferably less than or equal to 1000 µm$^2$, even further preferably less than or equal to 100 µm$^2$.

Note that a micro LED has a structure in which an active layer is sandwiched between clad layers between electrodes. The electrodes are preferably formed using a conductive material that transmits visible light so that the electrodes can emit light. In the active layer, electrons and holes are bonded to emit light. That is, the active layer can be referred to as a light-emitting layer. One of the clad layers between which the active layer is sandwiched is an n-type clad layer and the other is a p-type clad layer. A stacked-layer structure including the clad layers and the active layer is formed to emit light of red, yellow, green, blue, or the like. For the stacked-layer structure, a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like can be used. For example, gallium nitride or a compound of indium and gallium nitride can be used.

A micro LED is formed on, for example, a carrier substrate such as a sapphire wafer. The micro LED is transferred from the carrier substrate to a substrate of a display.

Figure 10A:
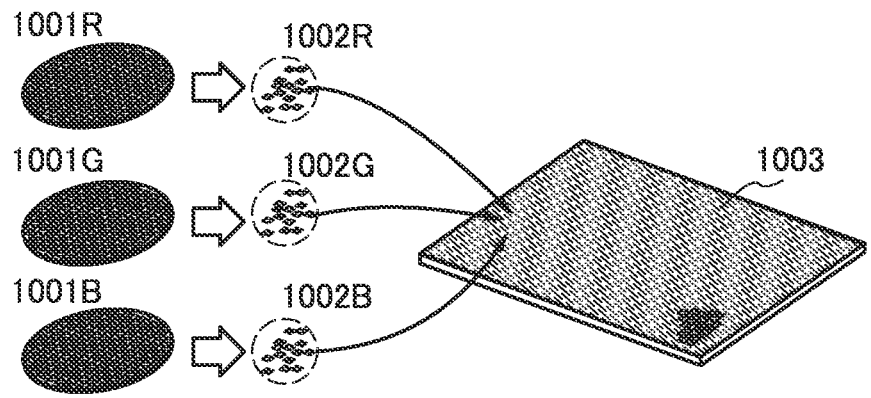
FIGS. 10A-10C Diagrams illustrating mounting examples of a display.

For example, as illustrated in FIG. 10(A), the micro LEDs are formed on different carrier substrates 1001R, 1001G, and 1001B for the respective colors (for example, red, green, and blue). Then, the micro LEDs (LED chips 1002R, 1002G, and 1002B) are each transferred to a substrate 1003. The substrate 1003 is a transistor substrate provided with a microcontroller in advance. With such a structure, the display described in the above embodiment can be achieved.

Figure 10B:
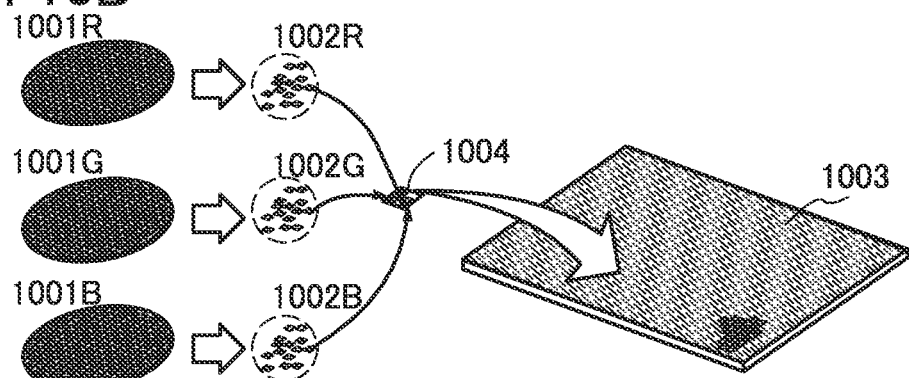

Note that the mounting method of the microcontroller and the display element on the display is not limited to that in FIG. 10(A). For example, as illustrated in FIG. 10(B), the micro LEDs may be formed on the different carrier substrates 1001R, 1001G, and 1001B for the respective colors (for example, red, green, and blue), and an LED chip 1004 on which the micro LEDs (the LED chips 1002R, 1002G, and 1002B) are integrated may be transferred to the substrate 1003. The substrate 1003 is a transistor substrate provided with a microcontroller in advance. With such a structure, the number of transfers of the LED chips to the transistor substrate provided with the microcontroller can be reduced and the display described in the above embodiment can be achieved.

Figure 10C:
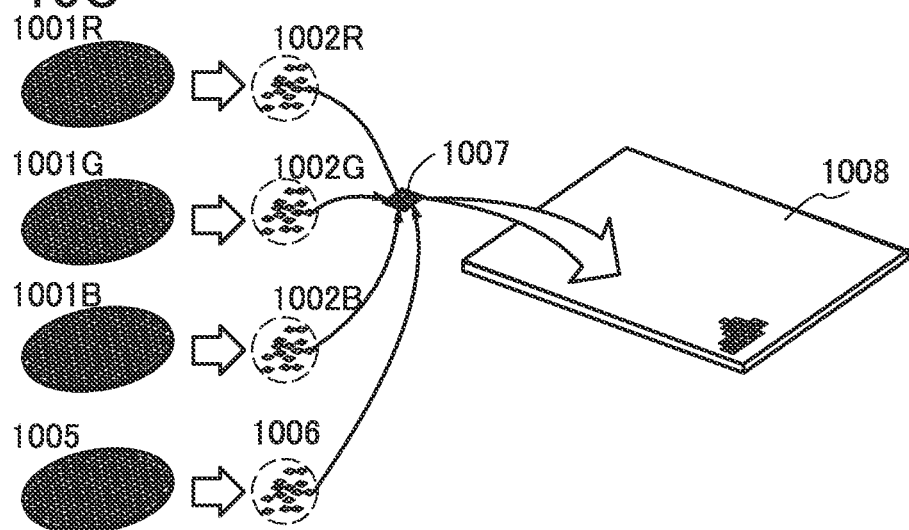

Note that the mounting method of the microcontroller and the display element on the display is not limited to those in FIGS. 10(A) and 10(B). For example, as illustrated in FIG. 10(C), the micro LEDs (the LED chips 1002R, 1002G, and 1002B) and a semiconductor chip 1006 having a circuit configuration of the microcontroller are prepared from the different carrier substrates 1001R, 1001G, and 1001B for the respective colors (for example, red, green, and blue) and a carrier substrate 1005 on which the microcontroller is formed. Furthermore, an LED chip 1007 on which the LED chips 1002R, 1002G, and 1002B and the semiconductor chip 1006 are integrated may be transferred to a substrate 1008. The substrate 1008 is a substrate provided with an electrode and a wiring. With such a structure, the display described in the above embodiment can be achieved using the chip on which the microcontroller and the micro LEDs are electrically connected to each other in advance.

This embodiment can be combined with the description of the other embodiments as appropriate.

Embodiment 5

In this embodiment, a semiconductor device that can be used for the display described as examples in the above embodiment will be described. The semiconductor device described below as an example can function as a memory device.

In this embodiment, a DOSRAM (registered trademark) will be described as an example of a memory device using an oxide semiconductor. The name "DOSRAM" stands for a Dynamic Oxide Semiconductor Random Access Memory. ADOSRAM refers to a memory device including a 1T1C (one transistor and one capacitor) cell where a writing transistor is formed using an oxide semiconductor.

A layered configuration example of a DOSRAM 1000 will be described with reference to FIG. 11. In the DOSRAM 1300, a sense amplifier portion 1302 that performs data reading and a cell array portion 1303 that stores data are stacked.

Figure 11:
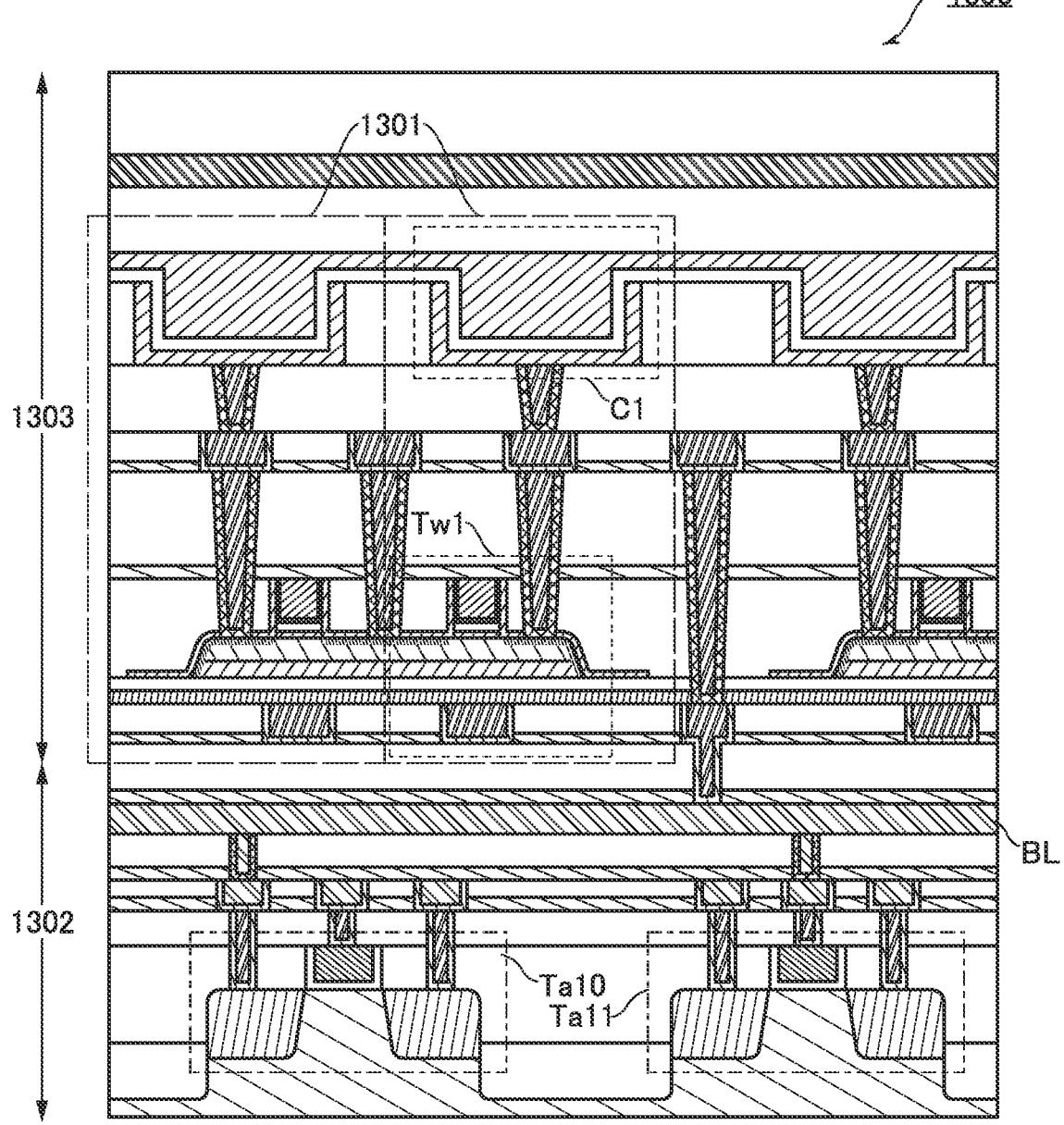
FIG. 11 A cross-sectional view illustrating a configuration example of a DOSRAM.

As illustrated in FIG. 11, the sense amplifier portion 1302 includes a bit line BL and Si transistors Ta10 and Ta11. The Si transistors Ta10 and Ta11 include a semiconductor layer in a single crystal silicon wafer. The Si transistors Ta10 and Ta11 are included in the sense amplifier and are electrically connected to the bit line BL.

The cell array portion 1303 includes a plurality of memory cells 1301. The memory cells 1301 include a transistor Tw1 and a capacitor C1. In the cell array portion 1303, two transistors Tw1 share a semiconductor layer. The semiconductor layer and the bit line BL are electrically connected to each other through a conductor that is not illustrated.

The layered configuration illustrated in FIG. 11 can be used for a variety of semiconductor devices formed by stacking a plurality of circuits each including a transistor group.

Metal oxides, insulators, conductors, and the like in FIG. 11 have either a single-layer structure or a layered structure. They can be formed by any of a variety of deposition methods such as a sputtering method, a molecular beam epitaxy (MBE) method, a pulsed laser ablation (PLA) method, a CVD method, and an atomic layer deposition (ALD) method. Examples of the CVD method include a plasma CVD method, a thermal CVD method, and a metal organic CVD method.

Here, the semiconductor layer of the transistor Tw1 is formed using a metal oxide (oxide semiconductor). An example is illustrated in which the semiconductor layer is formed of three metal oxide layers. The semiconductor layer is preferably formed using a metal oxide containing In, Ga, and Zn.

When an element that forms oxygen vacancies or an element that is bonded to oxygen vacancies is added to the metal oxide, the metal oxide may have increased carrier density and thus have reduced resistance. For example, the resistance of the semiconductor layer formed using the metal oxide is selectively reduced, whereby a source region or a drain region can be provided in the semiconductor layer.

As the element that reduces the resistance of the metal oxide, boron or phosphorus is typically used. Hydrogen, carbon, nitrogen, fluorine, sulfur, chlorine, titanium, a rare gas, or the like can also be used. Typical examples of the rare gas include helium, neon, argon, krypton, and xenon. The concentration of the element can be measured by secondary ion mass spectrometry (SIMS) or the like.

In particular, boron and phosphorus are preferably used because an apparatus used in a manufacturing line for amorphous silicon or low-temperature polysilicon can be used. Since the existing facility can be used, capital investment can be reduced.

The transistor including the semiconductor layer having selectively reduced resistance can be formed using a dummy gate, for example. Specifically, the dummy gate is provided over the semiconductor layer, and an element that reduces the resistance of the semiconductor layer is preferably added to the semiconductor layer using the dummy gate as a mask. That is, the element is added to a region of the semiconductor layer that does not overlap with the dummy gate, so that a low-resistance region is formed. For the addition of the element, an ion implantation method by which an ionized source gas is subjected to mass separation and then added, an ion doping method by which an ionized source gas is added without mass separation, a plasma immersion ion implantation method, or the like can be used.

Examples of a conductive material used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

Examples of an insulating material used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Note that in this specification and the like, an oxynitride refers to a compound that contains more oxygen than nitrogen, and a nitride oxide refers to a compound that contains more nitrogen than oxygen.

Embodiment 6

In this embodiment, electronic devices including the display of one embodiment of the present invention are described with reference to drawings.

The display described in the above embodiments can be mounted on the electronic devices described below as examples. Accordingly, an electronic device capable of displaying an image with a small change in chromaticity and high luminance while achieving low power consumption can be provided.

Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, a wearable display, and a large game machine like a pachinko machine.

The electronic device of one embodiment of the present invention can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 12A:
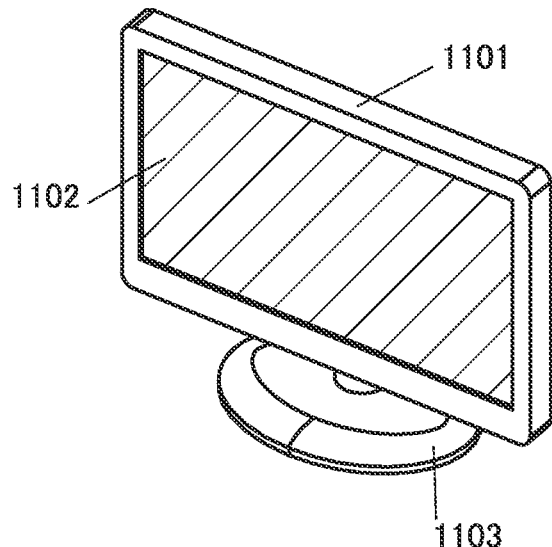
FIGS. 12A-12C Diagrams illustrating application examples of the display.

FIG. 12(A) illustrates an example of a television device. In a television device 1100, a display 1102 is incorporated in a housing 1101. Here, a configuration in which the housing 1101 is supported by a stand 1103 is illustrated.

The display of one embodiment of the present invention can be applied to the display 1102. Accordingly, a television device capable of displaying an image with a small change in chromaticity and high luminance while achieving low power consumption can be provided.

Figure 12B:
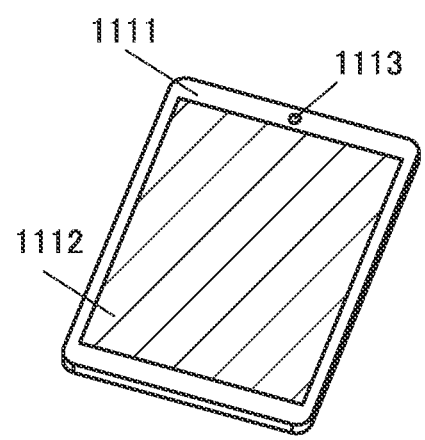

FIG. 12(B) illustrates a portable electronic device 1110. In the portable electronic device 1110, a display 1112 is incorporated in a housing 1111. FIG. 12(B) illustrates an imaging device 1113 in the housing 1111.

The display of one embodiment of the present invention can be applied to the display 1112. Accordingly, a portable electronic device 1110 capable of displaying an image with a small change in chromaticity and high luminance while achieving low power consumption can be provided. Note that since the luminance of the display 1112 can be increased, the display 1112 can be used as a light source when the imaging device 1113 is used. Accordingly, a highly convenient portable electronic device 1110 can be provided.

Figure 12C:
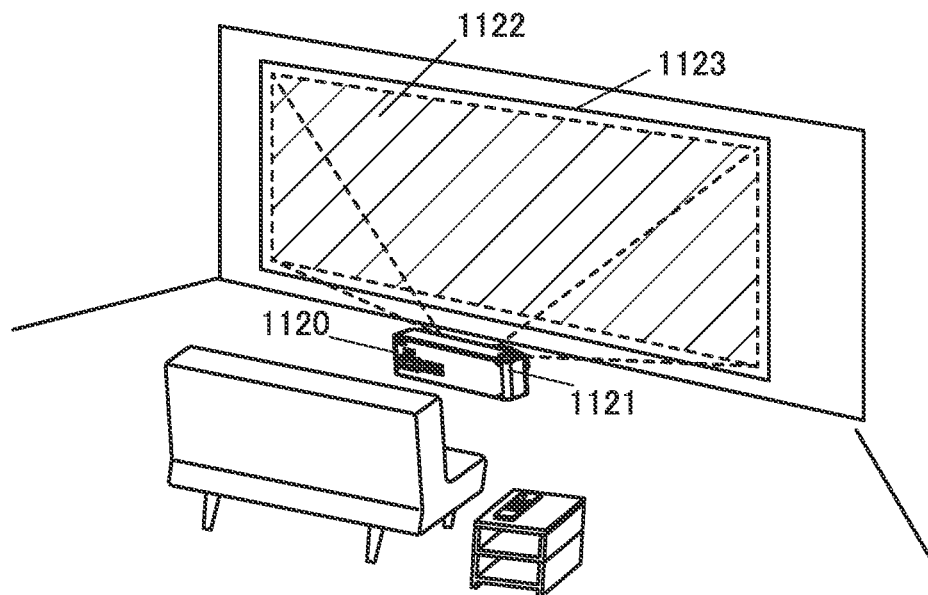

FIG. 12(C) illustrates a projection display device 1120 and an image to be projected. In the projection display device 1120, a display and a projection lens are incorporated in a housing 1121. Furthermore, FIG. 12(C) illustrates a screen 1123 to display an image 1122 projected from the projection display device 1120.

The display of one embodiment of the present invention can be applied to the display in the housing 1121. Accordingly, a projection display device 1120 capable of displaying an image with a small change in chromaticity and high luminance while achieving low power consumption can be provided.

Furthermore, the display of one embodiment of the present invention has excellent visibility outdoors because of its high luminance. Therefore, the display of one embodiment of the present invention can be used as a headlight of an automobile, for example.

Figure 13A:
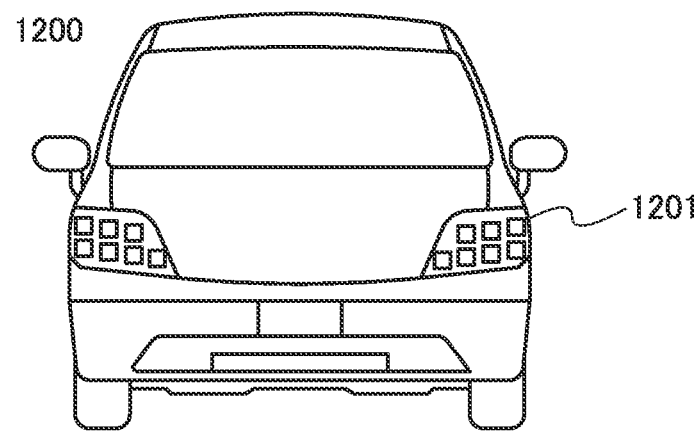
FIGS. 13A-13B Diagrams illustrating application examples of the display.

FIG. 13(A) illustrates an automobile 1200. In the automobile 1200, a display 1201 which can be used as a light source is incorporated as a headlight.

Figure 13B:
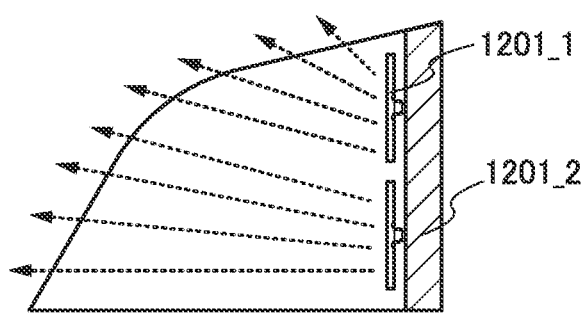

The display of one embodiment of the present invention can be applied to the display 1201. Accordingly, an automobile 1200 capable of emitting light with a small change in chromaticity and high luminance while achieving low power consumption can be provided. Note that the display 1201 can display an image with high visibility on top of emitting light with high luminance; hence, the display 1201 can be used as a communication method. Furthermore, as illustrated in FIG. 13(B), by being equipped with a plurality of displays 1201_1 and 1201_2, the display 1201 can display a function of an indicator, a function of a brake lamp, and the like separately depending on the color in addition to being able to diffuse the emission direction of light.

This embodiment can be combined with the description of the other embodiments as appropriate.

REFERENCE NUMERALS

10: display, 11: display portion, 13: gate driver, 14: source driver, 15: power supply circuit, 20: pixel, 30: microcontroller, 90: display element, SL: wiring, GL: wiring, VL: wiring, 31: transistor, 32: capacitor, 33: triangular wave generator circuit, 34: comparator, 35: constant current circuit, 36: switch

The invention claimed is:

1. A display device comprising:
a pixel,
wherein the pixel comprises a micro light-emitting diode, a first transistor, a second transistor, and a third transistor,
wherein one of a source and a drain of the first transistor is electrically connected to the micro light-emitting diode, wherein the other of the source and the drain of the first transistor is electrically connected to a wiring,
wherein a gate of the first transistor is electrically connected to one of a source and a drain of the second transistor,
wherein the other of the source and the drain of the second transistor is electrically connected to a gate of the third transistor, and
wherein one of a source and a drain of the third transistor is electrically connected to the wiring.

2. The display device according to claim 1,
wherein the second transistor comprises an oxide semiconductor in a channel formation region.

3. The display device according to claim 2,
wherein the first transistor and the third transistor each comprises silicon in a channel formation region.

4. The display device according to claim 1,
wherein a triangle wave is input to the pixel.

5. The display device according to claim 1,
wherein the gate of the first transistor is directly connected to the one of the source and the drain of the second transistor, and
wherein the other of the source and the drain of the second transistor is directly connected to the gate of the third transistor.

6. A display device comprising:
a pixel,
wherein the pixel comprises a micro light-emitting diode, a first transistor, a second transistor, a third transistor, and a fourth transistor,
wherein one of a source and a drain of the first transistor is electrically connected to the micro light-emitting diode,
wherein the other of the source and the drain of the first transistor is electrically connected to a first wiring,
wherein a gate of the first transistor is electrically connected to one of a source and a drain of the second transistor,
wherein the other of the source and the drain of the second transistor is electrically connected to a gate of the third transistor,
wherein the other of the source and the drain of the second transistor is electrically connected to one of a source and a drain of the fourth transistor,
wherein a gate of the second transistor is electrically connected to a second wiring,
wherein one of a source and a drain of the third transistor is electrically connected to the first wiring, and
wherein a gate of the fourth transistor is electrically connected to the second wiring.

7. The display device according to claim 6,
wherein the second transistor and the fourth transistor each comprises an oxide semiconductor in a channel formation region.

8. The display device according to claim 7,
wherein the first transistor and the third transistor each comprises silicon in a channel formation region.

9. The display device according to claim 6,
wherein a triangle wave is input to the pixel.

10. The display device according to claim 6,
wherein the gate of the first transistor is directly connected to the one of the source and the drain of the second transistor, and
wherein the other of the source and the drain of the second transistor is directly connected to the gate of the third transistor.

11. A display device comprising:
a pixel,
wherein the pixel comprises a micro light-emitting diode, a first transistor, a second transistor, a third transistor, and a fourth transistor,
wherein one of a source and a drain of the first transistor is electrically connected to the micro light-emitting diode,
wherein the other of the source and the drain of the first transistor is electrically connected to a first wiring,
wherein a gate of the first transistor is electrically connected to one of a source and a drain of the second transistor,
wherein the other of the source and the drain of the second transistor is electrically connected to a gate of the third transistor,
wherein the other of the source and the drain of the second transistor is electrically connected to one of a source and a drain of the third transistor,
wherein the other of the source and the drain of the second transistor is electrically connected to one of a source and a drain of the fourth transistor,
wherein a gate of the second transistor is electrically connected to a second wiring,
wherein one of a source and a drain of the third transistor is electrically connected to the first wiring, and
wherein a gate of the fourth transistor is electrically connected to the second wiring.

12. The display device according to claim 11,
wherein the second transistor and the fourth transistor each comprises an oxide semiconductor in a channel formation region.

13. The display device according to claim 12,
wherein the first transistor and the third transistor each comprises silicon in a channel formation region.

14. The display device according to claim 11,
wherein a triangle wave is input to the pixel.

15. The display device according to claim 11,
wherein the gate of the first transistor is directly connected to the one of the source and the drain of the second transistor, and
wherein the other of the source and the drain of the second transistor is directly connected to the gate of the third transistor.

* * * * *